United States Patent
Fu et al.

(10) Patent No.: US 12,061,293 B2
(45) Date of Patent: Aug. 13, 2024

(54) SILICON PHOTOMULTIPLIER BASED LiDAR

(71) Applicant: Motional AD LLC, Boston, MA (US)

(72) Inventors: Geng Fu, Belmont, MA (US); Yong Zhou, Pittsburgh, PA (US); Michael Morelli, San Jose, CA (US)

(73) Assignee: Motional AD LLC, Boston, MA (US)

( * ) Notice: Subject to any disclaimer, the term of this patent is extended or adjusted under 35 U.S.C. 154(b) by 294 days.

(21) Appl. No.: 17/744,392

(22) Filed: May 13, 2022

(65) Prior Publication Data

US 2022/0365179 A1    Nov. 17, 2022

Related U.S. Application Data

(60) Provisional application No. 63/188,788, filed on May 14, 2021.

(51) Int. Cl.
*G01S 7/48*        (2006.01)
*G01S 7/4863*    (2020.01)
(Continued)

(52) U.S. Cl.
CPC ............ *G01S 7/4863* (2013.01); *G01T 1/248* (2013.01); *H01L 31/107* (2013.01)

(58) Field of Classification Search
None
See application file for complete search history.

(56) References Cited

U.S. PATENT DOCUMENTS 9,271,694 B2    3/2016    Kim et al.
9,658,158 B2    5/2017    Renna et al.
(Continued)

FOREIGN PATENT DOCUMENTS

KR          101936193        1/2019
WO    WO 2006/073875    7/2006
(Continued)

OTHER PUBLICATIONS

[No Author Listed], "Surface Vehicle Recommended Practice: Taxonomy and Definitions for Terms Related to Driving Automation Systems for On-Road Motor Vehicles," SAE International, Standard J3016, Sep. 30, 2016, 30 pages.
(Continued)

*Primary Examiner* — Hoon K Song
(74) *Attorney, Agent, or Firm* — Fish & Richardson P.C.

(57) ABSTRACT

Provided are methods, systems, and computer program products for a LiDAR with an increased dynamic range. The method includes filtering output pulses of an SiPM device to a substantially symmetric pulse shape and capturing timing information and intensity information of the filtered output pulses for at least one predetermined intensity level. The method includes monitoring saturation of the SiPM device, wherein a width of a saturation plateau of a respective output pulse is determined in response to saturation of the SiPM device. The method also includes extrapolating additional timing information and additional intensity information of the respective output pulse using the captured timing information, the captured intensity information, and the determined width of the saturation plateau.

20 Claims, 12 Drawing Sheets

(51) Int. Cl.
  *G01T 1/24* (2006.01)
  *H01L 31/107* (2006.01)

(56) References Cited

U.S. PATENT DOCUMENTS

| | | |
|---|---|---|
| 10,901,074 B1 | 1/2021 | Pan et al. |
| 11,428,791 B1 | 8/2022 | Fu |
| 11,435,451 B1 | 9/2022 | Fu |
| 2011/0147567 A1 | 6/2011 | Grazioso et al. |
| 2012/0068050 A1 | 3/2012 | Mazzillo et al. |
| 2015/0168567 A1 | 6/2015 | Kim et al. |
| 2016/0259038 A1 | 9/2016 | Retterath et al. |
| 2018/0102442 A1 | 4/2018 | Wang et al. |
| 2018/0149753 A1 | 5/2018 | Shin et al. |
| 2018/0162632 A1 | 6/2018 | Craig |
| 2018/0164416 A1 | 6/2018 | Ekengren |
| 2018/0259625 A1 | 9/2018 | Gnecchi et al. |
| 2019/0082128 A1 | 3/2019 | Oh |
| 2019/0182415 A1 | 6/2019 | Sivan et al. |
| 2019/0250257 A1* | 8/2019 | Finkelstein ......... G01S 7/4863 |
| 2019/0288132 A1 | 9/2019 | Wang et al. |
| 2019/0312158 A1 | 10/2019 | Chen et al. |
| 2019/0368864 A1 | 12/2019 | Wolke et al. |
| 2020/0025896 A1 | 1/2020 | Gunnam |
| 2020/0075652 A1 | 3/2020 | Chen et al. |
| 2020/0110159 A1 | 4/2020 | Wohlgenannt et al. |
| 2020/0116559 A1 | 4/2020 | Pacala et al. |
| 2020/0135776 A1* | 4/2020 | Finkelstein ......... H01L 31/0232 |
| 2020/0284884 A1 | 9/2020 | Henderson et al. |
| 2021/0109199 A1 | 4/2021 | Hennecke et al. |
| 2021/0278257 A1 | 9/2021 | Dharia et al. |
| 2021/0293931 A1 | 9/2021 | Nemet et al. |
| 2021/0325541 A1 | 10/2021 | Kim et al. |
| 2021/0389467 A1 | 12/2021 | Eshel et al. |
| 2021/0396857 A1 | 12/2021 | Fu et al. |
| 2023/0119438 A1 | 4/2023 | Fu |
| 2023/0121582 A1 | 4/2023 | Fu |
| 2024/0077586 A1* | 3/2024 | Lee ......... G01S 7/4873 |

FOREIGN PATENT DOCUMENTS

| | | |
|---|---|---|
| WO | WO 2018/162632 | 9/2018 |
| WO | WO 2020/033749 | 2/2020 |

OTHER PUBLICATIONS

Acerbi et al., "Understanding and simulating SiPMs," Nucl. Instrum. Methods Phys. Res. A: Accel. Spectrom. Detect. Assoc. Equip., May 2019, 926:16-35.

Agishev et al., "Lidar with SiPM: Some capabilities and limitations in real environment," Optics & Laser Technology, Jul. 1, 2013, 49:86-90.

Dolinsky et al., "Timing resolution performance comparison for fast and standard outputs of SensL SiPM," 2013 IEEE Nuclear Science Symposium and Medical Imaging Conference, Oct. 27, 2013, 6 pages.

Gnecchi et al., "A 1× 16 SiPM array for automotive 3D imaging LiDAR systems," Proceedings of the 2017 International Image Sensor Workshop (IISW), Hiroshima, Japan, May 30, 2017, 133-36.

Gnecchi et al., "Long Distance Ranging Performance of Gen3 LiDAR Imaging System based on 1× 16 SiPM Array," Proceedings of the International Image Sensors Society (IISS) Workshop, Snowbird, UT, USA, Jun. 2019, 23-7.

International Search Report and Written Opinion in International Appln. No. PCT/US2022/029252, dated Sep. 21, 2022, 8 pages.

Villa et al., "SPADs and SiPMs Arrays for Long-Range High-Speed Light Detection and Ranging (LiDAR)," Sensors, Jan. 21, 2021, 21(11):3839.

* cited by examiner

SILICON PHOTOMULTIPLIER BASED LiDAR

CROSS REFERENCE TO RELATED APPLICATIONS

This application claims priority to U.S. Provisional Patent Application No. 63/188,788, filed May 14, 2021, the entire contents of which are incorporated herein by reference.

BACKGROUND

Laser Detection and Ranging (LiDAR) is used to capture information from a signal emitted by an emitter, reflected by an object, and detected by a detector. The information is used to determine features associated with the object, such as the range to the object, velocity of the object, and the like. In a pulsed time-of-flight (TOF) LiDAR system, signals emitted by the transmitter include a series of laser pulses. In a continuous wave (CW) LiDAR system, the signals emitted by the transmitter are sinusoidal with a known wavelength.

DETAILED DESCRIPTION

Figure 1:
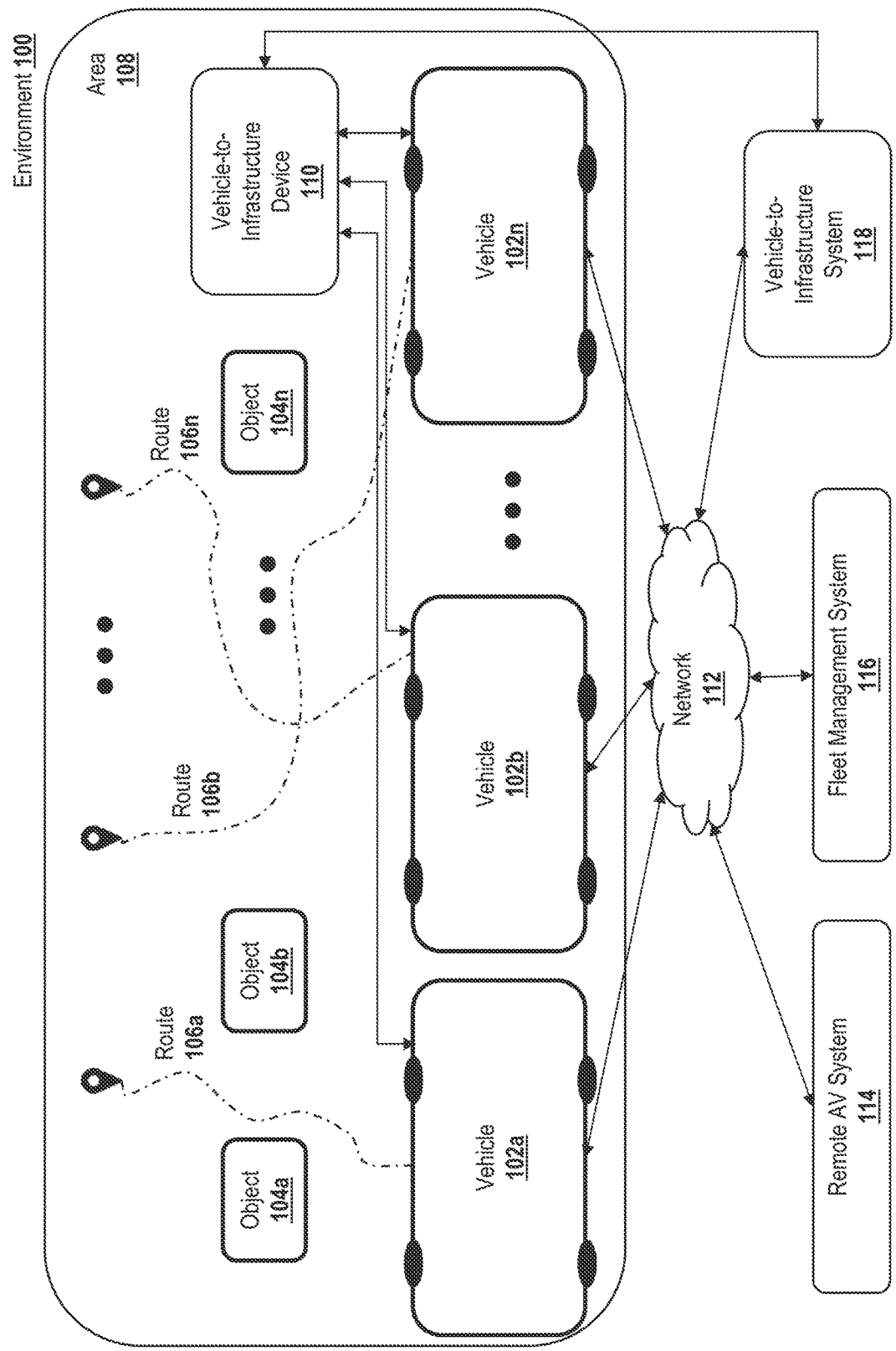
FIG. 1 is an example environment in which a vehicle including one or more components of an autonomous system can be implemented.

In the following description numerous specific details are set forth in order to provide a thorough understanding of the present disclosure for the purposes of explanation. It will be apparent, however, that the embodiments described by the present disclosure can be practiced without these specific details. In some instances, well-known structures and devices are illustrated in block diagram form in order to avoid unnecessarily obscuring aspects of the present disclosure.

Specific arrangements or orderings of schematic elements, such as those representing systems, devices, modules, instruction blocks, data elements, and/or the like are illustrated in the drawings for ease of description. However, it will be understood by those skilled in the art that the specific ordering or arrangement of the schematic elements in the drawings is not meant to imply that a particular order or sequence of processing, or separation of processes, is required unless explicitly described as such. Further, the inclusion of a schematic element in a drawing is not meant to imply that such element is required in all embodiments or that the features represented by such element may not be included in or combined with other elements in some embodiments unless explicitly described as such.

Further, where connecting elements such as solid or dashed lines or arrows are used in the drawings to illustrate a connection, relationship, or association between or among two or more other schematic elements, the absence of any such connecting elements is not meant to imply that no connection, relationship, or association can exist. In other words, some connections, relationships, or associations between elements are not illustrated in the drawings so as not to obscure the disclosure. In addition, for ease of illustration, a single connecting element can be used to represent multiple connections, relationships or associations between elements. For example, where a connecting element represents communication of signals, data, or instructions (e.g., "software instructions"), it should be understood by those skilled in the art that such element can represent one or multiple signal paths (e.g., a bus), as may be needed, to affect the communication.

Although the terms first, second, third, and/or the like are used to describe various elements, these elements should not be limited by these terms. The terms first, second, third, and/or the like are used only to distinguish one element from another. For example, a first contact could be termed a second contact and, similarly, a second contact could be termed a first contact without departing from the scope of the described embodiments. The first contact and the second contact are both contacts, but they are not the same contact.

The terminology used in the description of the various described embodiments herein is included for the purpose of describing particular embodiments only and is not intended to be limiting. As used in the description of the various described embodiments and the appended claims, the singular forms "a," "an" and "the" are intended to include the plural forms as well and can be used interchangeably with "one or more" or "at least one," unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this description specify the presence of stated features, integers, steps, operations, elements, and/or components, but do not preclude the presence or addition of one or more other features, integers, steps, operations, elements, components, and/or groups thereof.

As used herein, the terms "communication" and "communicate" refer to at least one of the reception, receipt, transmission, transfer, provision, and/or the like of information (or information represented by, for example, data, signals, messages, instructions, commands, and/or the like). For one unit (e.g., a device, a system, a component of a device or system, combinations thereof, and/or the like) to be in communication with another unit means that the one unit is able to directly or indirectly receive information from and/or send (e.g., transmit) information to the other unit. This may refer to a direct or indirect connection that is wired and/or wireless in nature. Additionally, two units may be in communication with each other even though the information transmitted may be modified, processed, relayed, and/or routed between the first and second unit. For example, a first unit may be in communication with a second unit even though the first unit passively receives information and does not actively transmit information to the second unit. As another example, a first unit may be in communication with a second unit if at least one intermediary unit (e.g., a third unit located between the first unit and the second unit) processes information received from the first unit and transmits the processed information to the second unit. In some embodiments, a message may refer to a network packet (e.g., a data packet and/or the like) that includes data.

As used herein, the term "if" is, optionally, construed to mean "when", "upon", "in response to determining," "in response to detecting," and/or the like, depending on the context. Similarly, the phrase "if it is determined" or "if [a stated condition or event] is detected" is, optionally, construed to mean "upon determining," "in response to determining," "upon detecting [the stated condition or event]," "in response to detecting [the stated condition or event]," and/or the like, depending on the context. Also, as used herein, the terms "has", "have", "having", or the like are intended to be open-ended terms. Further, the phrase "based on" is intended to mean "based at least partially on" unless explicitly stated otherwise.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments can be practiced without these specific details. In other instances, well-known methods, procedures, components, circuits, and networks have not been described in detail so as not to unnecessarily obscure aspects of the embodiments.

General Overview

In some aspects and/or embodiments, systems, methods, and computer program products described herein include and/or implement a silicon photomultiplier (SiPM) based LiDAR. Generally, a SiPM based time-of-flight (ToF) LiDAR includes one or more SiPM devices (pixels) that capture return signals (e.g., reflections, optical photons) from the environment. An SiPM device according to the present techniques is operable to detect captured information in the presence of saturation. A return signal is filtered, and timing information and intensity information are extracted from the filtered output pulse. In response to a saturation plateau being reached by the filtered output pulse, intensity information corresponding to the saturation plateau is extrapolated from the filtered output pulse shape (e.g. plateau width, rising edge slope).

By virtue of the implementation of systems, methods, and computer program products described herein, techniques for SiPM based TOF LiDAR enables a high dynamic range (DR) sensor output that provides accurate return signal intensity and object reflectivity information. SiPMs are commonly subjected to saturation. The present techniques enable the determination of intensity in the presence of sensor saturation. Traditionally, the dynamic range of the SiPM is limited by the number of microcells in each SiPM pixel, which fundamentally limits the intensity and reflectivity accuracy. The present techniques minimize the impact of a long SPAD recharge time and monitor the saturation time to increase the dynamic range of SiPM without requiring an increase in the number of microcells.

Referring now to FIG. 1, illustrated is example environment 100 in which vehicles that include autonomous systems, as well as vehicles that do not, are operated. As illustrated, environment 100 includes vehicles 102a-102n, objects 104a-104n, routes 106a-106n, area 108, vehicle-to-infrastructure (V2I) device 110, network 112, remote autonomous vehicle (AV) system 114, fleet management system 116, and V2I system 118. Vehicles 102a-102n, vehicle-to-infrastructure (V2I) device 110, network 112, autonomous vehicle (AV) system 114, fleet management system 116, and V2I system 118 interconnect (e.g., establish a connection to communicate and/or the like) via wired connections, wireless connections, or a combination of wired or wireless connections. In some embodiments, objects 104a-104n interconnect with at least one of vehicles 102a-102n, vehicle-to-infrastructure (V2I) device 110, network 112, autonomous vehicle (AV) system 114, fleet management system 116, and V2I system 118 via wired connections, wireless connections, or a combination of wired or wireless connections.

Vehicles 102a-102n (referred to individually as vehicle 102 and collectively as vehicles 102) include at least one device configured to transport goods and/or people. In some embodiments, vehicles 102 are configured to be in communication with V2I device 110, remote AV system 114, fleet management system 116, and/or V2I system 118 via network 112. In some embodiments, vehicles 102 include cars, buses, trucks, trains, and/or the like. In some embodiments, vehicles 102 are the same as, or similar to, vehicles 200, described herein (see FIG. 2). In some embodiments, a vehicle 200 of a set of vehicles 200 is associated with an autonomous fleet manager. In some embodiments, vehicles 102 travel along respective routes 106a-106n (referred to individually as route 106 and collectively as routes 106), as described herein. In some embodiments, one or more vehicles 102 include an autonomous system (e.g., an autonomous system that is the same as or similar to autonomous system 202).

Objects 104a-104n (referred to individually as object 104 and collectively as objects 104) include, for example, at least one vehicle, at least one pedestrian, at least one cyclist, at least one structure (e.g., a building, a sign, a fire hydrant, etc.), and/or the like. Each object 104 is stationary (e.g., located at a fixed location for a period of time) or mobile (e.g., having a velocity and associated with at least one trajectory). In some embodiments, objects 104 are associated with corresponding locations in area 108.

Routes 106a-106n (referred to individually as route 106 and collectively as routes 106) are each associated with (e.g., prescribe) a sequence of actions (also known as a trajectory) connecting states along which an AV can navigate. Each route 106 starts at an initial state (e.g., a state that corresponds to a first spatiotemporal location, velocity, and/or the like) and a final goal state (e.g., a state that corresponds to a second spatiotemporal location that is different from the first spatiotemporal location) or goal region (e.g. a subspace of acceptable states (e.g., terminal states)). In some embodiments, the first state includes a location at which an individual or individuals are to be picked-up by the AV and the second state or region includes a location or locations at which the individual or individuals picked-up by the AV are to be dropped-off. In some embodiments, routes 106 include a plurality of acceptable state sequences (e.g., a plurality of spatiotemporal location sequences), the plurality of state sequences associated with (e.g., defining) a plurality of trajectories. In an example, routes 106 include only high level actions or imprecise state locations, such as a series of connected roads dictating turning directions at roadway intersections. Additionally, or alternatively, routes 106 may include more precise actions or states such as, for example, specific target lanes or precise locations within the lane areas and targeted speed at those positions. In an example, routes 106 include a plurality of precise state sequences along the at least one high level action sequence with a limited look ahead horizon to reach intermediate goals, where the combination of successive iterations of limited horizon state sequences cumulatively correspond to a plurality of trajectories that collectively form the high level route to terminate at the final goal state or region.

Area 108 includes a physical area (e.g., a geographic region) within which vehicles 102 can navigate. In an example, area 108 includes at least one state (e.g., a country, a province, an individual state of a plurality of states included in a country, etc.), at least one portion of a state, at least one city, at least one portion of a city, etc. In some embodiments, area 108 includes at least one named thoroughfare (referred to herein as a "road") such as a highway, an interstate highway, a parkway, a city street, etc. Additionally, or alternatively, in some examples area 108 includes at least one unnamed road such as a driveway, a section of a parking lot, a section of a vacant and/or undeveloped lot, a dirt path, etc. In some embodiments, a road includes at least one lane (e.g., a portion of the road that can be traversed by vehicles 102). In an example, a road includes at least one lane associated with (e.g., identified based on) at least one lane marking.

Vehicle-to-Infrastructure (V2I) device 110 (sometimes referred to as a Vehicle-to-Infrastructure (V2X) device) includes at least one device configured to be in communication with vehicles 102 and/or V2I infrastructure system 118. In some embodiments, V2I device 110 is configured to be in communication with vehicles 102, remote AV system 114, fleet management system 116, and/or V2I system 118 via network 112. In some embodiments, V2I device 110 includes a radio frequency identification (RFID) device, signage, cameras (e.g., two-dimensional (2D) and/or three-dimensional (3D) cameras), lane markers, streetlights, parking meters, etc. In some embodiments, V2I device 110 is configured to communicate directly with vehicles 102. Additionally, or alternatively, in some embodiments V2I device 110 is configured to communicate with vehicles 102, remote AV system 114, and/or fleet management system 116 via V2I system 118. In some embodiments, V2I device 110 is configured to communicate with V2I system 118 via network 112.

Network 112 includes one or more wired and/or wireless networks. In an example, network 112 includes a cellular network (e.g., a long term evolution (LTE) network, a third generation (3G) network, a fourth generation (4G) network, a fifth generation (5G) network, a code division multiple access (CDMA) network, etc.), a public land mobile network (PLMN), a local area network (LAN), a wide area network (WAN), a metropolitan area network (MAN), a telephone network (e.g., the public switched telephone network (PSTN), a private network, an ad hoc network, an intranet, the Internet, a fiber optic-based network, a cloud computing network, etc., a combination of some or all of these networks, and/or the like.

Remote AV system 114 includes at least one device configured to be in communication with vehicles 102, V2I device 110, network 112, remote AV system 114, fleet management system 116, and/or V2I system 118 via network 112. In an example, remote AV system 114 includes a server, a group of servers, and/or other like devices. In some embodiments, remote AV system 114 is co-located with the fleet management system 116. In some embodiments, remote AV system 114 is involved in the installation of some or all of the components of a vehicle, including an autonomous system, an autonomous vehicle compute, software implemented by an autonomous vehicle compute, and/or the like. In some embodiments, remote AV system 114 maintains (e.g., updates and/or replaces) such components and/or software during the lifetime of the vehicle.

Fleet management system 116 includes at least one device configured to be in communication with vehicles 102, V2I device 110, remote AV system 114, and/or V2I infrastructure system 118. In an example, fleet management system 116 includes a server, a group of servers, and/or other like devices. In some embodiments, fleet management system 116 is associated with a ridesharing company (e.g., an organization that controls operation of multiple vehicles (e.g., vehicles that include autonomous systems and/or vehicles that do not include autonomous systems) and/or the like).

In some embodiments, V2I system 118 includes at least one device configured to be in communication with vehicles 102, V2I device 110, remote AV system 114, and/or fleet management system 116 via network 112. In some examples, V2I system 118 is configured to be in communication with V2I device 110 via a connection different from network 112. In some embodiments, V2I system 118 includes a server, a group of servers, and/or other like devices. In some embodiments, V2I system 118 is associated with a municipality or a private institution (e.g., a private institution that maintains V2I device 110 and/or the like).

The number and arrangement of elements illustrated in FIG. 1 are provided as an example. There can be additional elements, fewer elements, different elements, and/or differently arranged elements, than those illustrated in FIG. 1. Additionally, or alternatively, at least one element of environment 100 can perform one or more functions described as being performed by at least one different element of FIG. 1. Additionally, or alternatively, at least one set of elements of environment 100 can perform one or more functions described as being performed by at least one different set of elements of environment 100.

Figure 2:
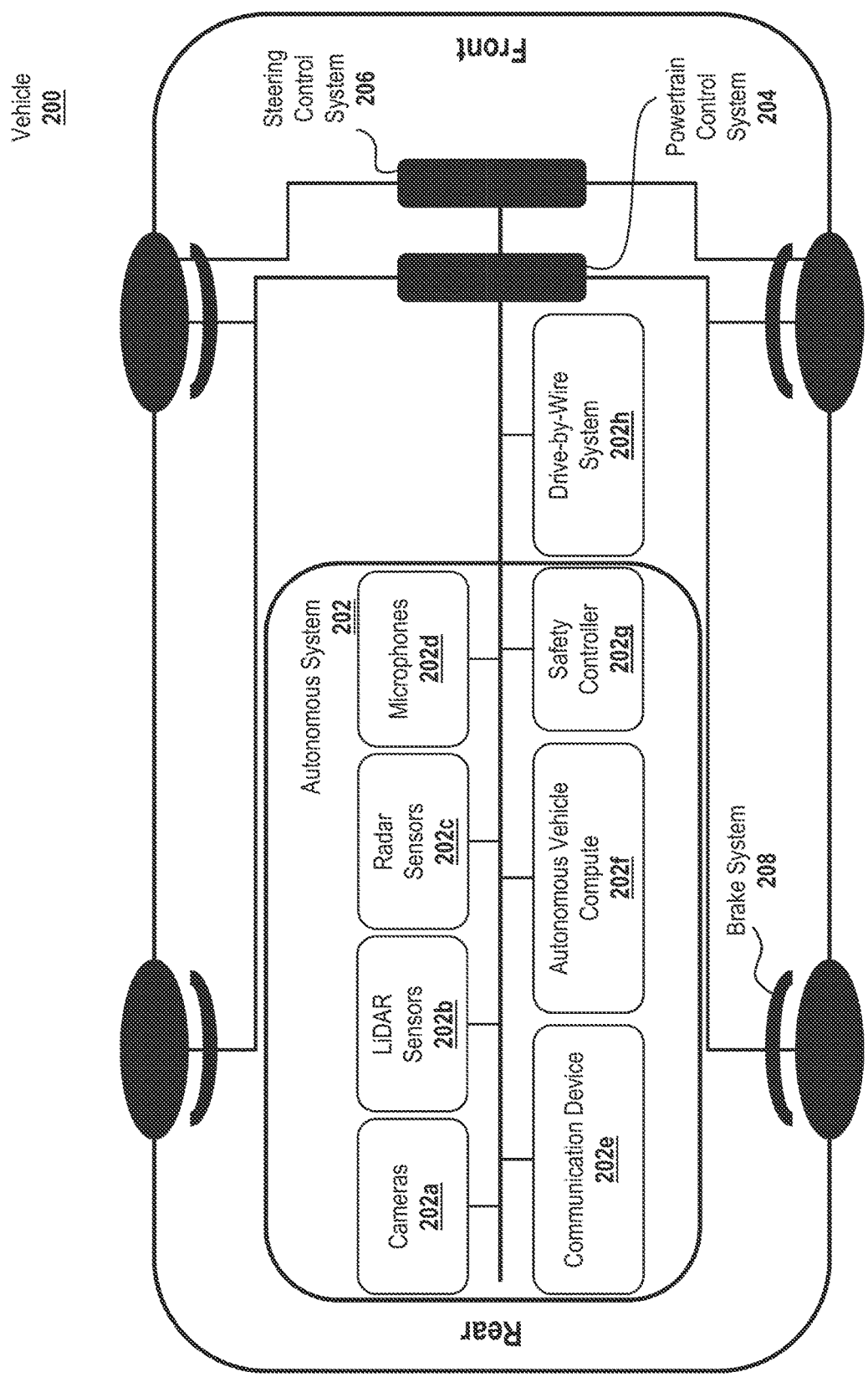
FIG. 2 is a diagram of one or more systems of a vehicle including an autonomous system.

Referring now to FIG. 2, vehicle 200 includes autonomous system 202, powertrain control system 204, steering control system 206, and brake system 208. In some embodiments, vehicle 200 is the same as or similar to vehicle 102 (see FIG. 1). In some embodiments, vehicle 102 have autonomous capability (e.g., implement at least one function, feature, device, and/or the like that enable vehicle 200 to be partially or fully operated without human intervention including, without limitation, fully autonomous vehicles (e.g., vehicles that forego reliance on human intervention), highly autonomous vehicles (e.g., vehicles that forego reliance on human intervention in certain situations), and/or the like). For a detailed description of fully autonomous vehicles and highly autonomous vehicles, reference may be made to SAE International's standard J3016: Taxonomy and Definitions for Terms Related to On-Road Motor Vehicle Automated Driving Systems, which is incorporated by reference in its entirety. In some embodiments, vehicle 200 is associated with an autonomous fleet manager and/or a ridesharing company.

Autonomous system 202 includes a sensor suite that includes one or more devices such as cameras 202a, LiDAR sensors 202b, radar sensors 202c, and microphones 202d. In some embodiments, autonomous system 202 can include more or fewer devices and/or different devices (e.g., ultrasonic sensors, inertial sensors, GPS receivers (discussed below), odometry sensors that generate data associated with an indication of a distance that vehicle 200 has traveled, and/or the like). In some embodiments, autonomous system 202 uses the one or more devices included in autonomous system 202 to generate data associated with environment 100, described herein. The data generated by the one or more devices of autonomous system 202 can be used by one or more systems described herein to observe the environment (e.g., environment 100) in which vehicle 200 is located. In some embodiments, autonomous system 202 includes communication device 202e, autonomous vehicle compute 202f, and drive-by-wire (DBW) system 202h.

Figure 3:
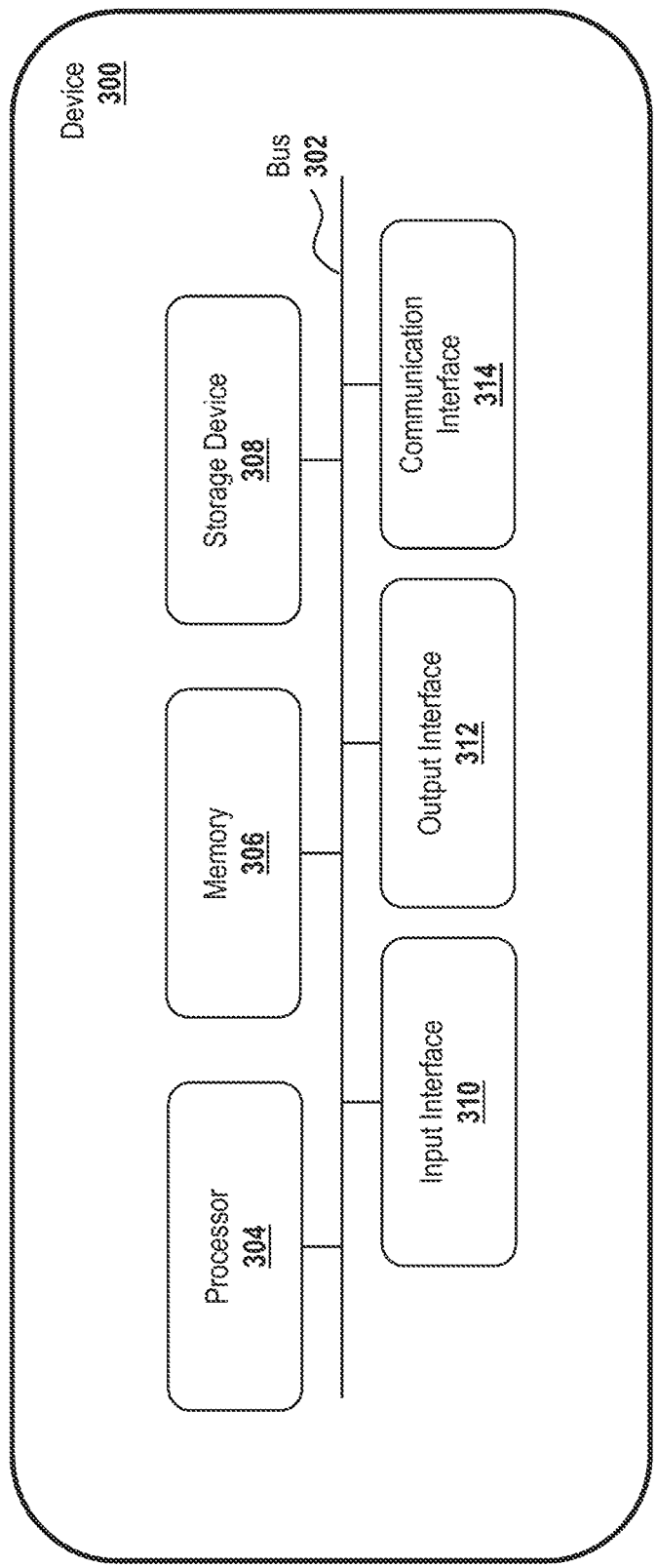
FIG. 3 is a diagram of components of one or more devices and/or one or more systems of FIGS. 1 and 2.

Cameras 202a include at least one device configured to be in communication with communication device 202e, autonomous vehicle compute 202f, and/or safety controller 202g via a bus (e.g., a bus that is the same as or similar to bus 302 of FIG. 3). Cameras 202a include at least one camera (e.g., a digital camera using a light sensor such as a charge-coupled device (CCD), a thermal camera, an infrared (IR) camera, an event camera, and/or the like) to capture images including physical objects (e.g., cars, buses, curbs, people, and/or the like). In some embodiments, camera 202a generates camera data as output. In some examples, camera 202a generates camera data that includes image data associated with an image. In this example, the image data may specify at least one parameter (e.g., image characteristics such as exposure, brightness, etc., an image timestamp, and/or the like) corresponding to the image. In such an example, the image may be in a format (e.g., RAW, JPEG, PNG, and/or the like). In some embodiments, camera 202a includes a plurality of independent cameras configured on (e.g., positioned on) a vehicle to capture images for the purpose of stereopsis (stereo vision). In some examples, camera 202a includes a plurality of cameras that generate image data and transmit the image data to autonomous vehicle compute 202f and/or a fleet management system (e.g., a fleet management system that is the same as or similar to fleet management system 116 of FIG. 1). In such an example, autonomous vehicle compute 202f determines depth to one or more objects in a field of view of at least two cameras of the plurality of cameras based on the image data from the at least two cameras. In some embodiments, cameras 202a is configured to capture images of objects within a distance from cameras 202a (e.g., up to 100 meters, up to a kilometer, and/or the like). Accordingly, cameras 202a include features such as sensors and lenses that are optimized for perceiving objects that are at one or more distances from cameras 202a.

In an embodiment, camera 202a includes at least one camera configured to capture one or more images associated with one or more traffic lights, street signs and/or other physical objects that provide visual navigation information. In some embodiments, camera 202a generates traffic light data associated with one or more images. In some examples, camera 202a generates TLD data associated with one or more images that include a format (e.g., RAW, JPEG, PNG, and/or the like). In some embodiments, camera 202a that generates TLD data differs from other systems described herein incorporating cameras in that camera 202a can include one or more cameras with a wide field of view (e.g., a wide-angle lens, a fish-eye lens, a lens having a viewing angle of approximately 120 degrees or more, and/or the like) to generate images about as many physical objects as possible.

Laser Detection and Ranging (LiDAR) sensors 202b include at least one device configured to be in communication with communication device 202e, autonomous vehicle compute 202f, and/or safety controller 202g via a bus (e.g., a bus that is the same as or similar to bus 302 of FIG. 3). The LiDAR sensors 202b may be a SiPM based LiDAR. LiDAR sensors 202b include a system configured to transmit light from a light emitter (e.g., a laser transmitter). Light emitted by LiDAR sensors 202b include light (e.g., infrared light and/or the like) that is outside of the visible spectrum. In some embodiments, during operation, light emitted by LiDAR sensors 202b encounters a physical object (e.g., a vehicle) and is reflected back to LiDAR sensors 202b. In some embodiments, the light emitted by LiDAR sensors 202b does not penetrate the physical objects that the light encounters. LiDAR sensors 202b also include at least one light detector which detects the light that was emitted from the light emitter after the light encounters a physical object. In some embodiments, at least one data processing system associated with LiDAR sensors 202b generates an image (e.g., a point cloud, a combined point cloud, and/or the like) representing the objects included in a field of view of LiDAR sensors 202b. In some examples, the at least one data processing system associated with LiDAR sensor 202b generates an image that represents the boundaries of a physical object, the surfaces (e.g., the topology of the surfaces) of the physical object, and/or the like. In such an example, the image is used to determine the boundaries of physical objects in the field of view of LiDAR sensors 202b.

Radio Detection and Ranging (radar) sensors 202c include at least one device configured to be in communication with communication device 202e, autonomous vehicle compute 202f, and/or safety controller 202g via a bus (e.g., a bus that is the same as or similar to bus 302 of FIG. 3). Radar sensors 202c include a system configured to transmit radio waves (either pulsed or continuously). The radio waves transmitted by radar sensors 202c include radio waves that are within a predetermined spectrum. In some embodiments, during operation, radio waves transmitted by radar sensors 202c encounter a physical object and are reflected back to radar sensors 202c. In some embodiments, the radio waves transmitted by radar sensors 202c are not reflected by some objects. In some embodiments, at least one data processing system associated with radar sensors 202c generates signals representing the objects included in a field of view of radar sensors 202c. For example, the at least one data processing system associated with radar sensor 202c generates an image that represents the boundaries of a physical object, the surfaces (e.g., the topology of the surfaces) of the physical object, and/or the like. In some examples, the image is used to determine the boundaries of physical objects in the field of view of radar sensors 202c.

Microphones 202d include at least one device configured to be in communication with communication device 202e, autonomous vehicle compute 202f, and/or safety controller 202g via a bus (e.g., a bus that is the same as or similar to bus 302 of FIG. 3). Microphones 202d include one or more microphones (e.g., array microphones, external microphones, and/or the like) that capture audio signals and generate data associated with (e.g., representing) the audio signals. In some examples, microphones 202d include transducer devices and/or like devices. In some embodiments, one or more systems described herein can receive the data generated by microphones 202d and determine a position of an object relative to vehicle 200 (e.g., a distance and/or the like) based on the audio signals associated with the data.

Communication device 202e include at least one device configured to be in communication with cameras 202a, LiDAR sensors 202b, radar sensors 202c, microphones 202d, autonomous vehicle compute 202f, safety controller 202g, and/or DBW system 202h. For example, communication device 202e may include a device that is the same as or similar to communication interface 314 of FIG. 3. In some embodiments, communication device 202e includes a vehicle-to-vehicle (V2V) communication device (e.g., a device that enables wireless communication of data between vehicles).

Autonomous vehicle compute 202f include at least one device configured to be in communication with cameras 202a, LiDAR sensors 202b, radar sensors 202c, microphones 202d, communication device 202e, safety controller 202g, and/or DBW system 202h. In some examples, autonomous vehicle compute 202f includes a device such as a client device, a mobile device (e.g., a cellular telephone, a tablet, and/or the like) a server (e.g., a computing device including one or more central processing units, graphical processing units, and/or the like), and/or the like. In some embodiments, autonomous vehicle compute 202f is the same as or similar to autonomous vehicle compute 400, described herein. Additionally, or alternatively, in some embodiments autonomous vehicle compute 202f is configured to be in communication with an autonomous vehicle system (e.g., an autonomous vehicle system that is the same as or similar to remote AV system 114 of FIG. 1), a fleet management system (e.g., a fleet management system that is the same as or similar to fleet management system 116 of FIG. 1), a V2I device (e.g., a V2I device that is the same as or similar to V2I device 110 of FIG. 1), and/or a V2I system (e.g., a V2I system that is the same as or similar to V2I system 118 of FIG. 1).

Safety controller 202g includes at least one device configured to be in communication with cameras 202a, LiDAR sensors 202b, radar sensors 202c, microphones 202d, communication device 202e, autonomous vehicle computer 202f, and/or DBW system 202h. In some examples, safety controller 202g includes one or more controllers (electrical controllers, electromechanical controllers, and/or the like) that are configured to generate and/or transmit control signals to operate one or more devices of vehicle 200 (e.g., powertrain control system 204, steering control system 206, brake system 208, and/or the like). In some embodiments, safety controller 202g is configured to generate control signals that take precedence over (e.g., overrides) control signals generated and/or transmitted by autonomous vehicle compute 202f.

DBW system 202h includes at least one device configured to be in communication with communication device 202e and/or autonomous vehicle compute 202f. In some examples, DBW system 202h includes one or more controllers (e.g., electrical controllers, electromechanical controllers, and/or the like) that are configured to generate and/or transmit control signals to operate one or more devices of vehicle 200 (e.g., powertrain control system 204, steering control system 206, brake system 208, and/or the like). Additionally, or alternatively, the one or more controllers of DBW system 202h are configured to generate and/or transmit control signals to operate at least one different device (e.g., a turn signal, headlights, door locks, windshield wipers, and/or the like) of vehicle 200.

Powertrain control system 204 includes at least one device configured to be in communication with DBW system 202h. In some examples, powertrain control system 204 includes at least one controller, actuator, and/or the like. In some embodiments, powertrain control system 204 receives control signals from DBW system 202h and powertrain control system 204 causes vehicle 200 to start moving forward, stop moving forward, start moving backward, stop moving backward, accelerate in a direction, decelerate in a direction, perform a left turn, perform a right turn, and/or the like. In an example, powertrain control system 204 causes the energy (e.g., fuel, electricity, and/or the like) provided to a motor of the vehicle to increase, remain the same, or decrease, thereby causing at least one wheel of vehicle 200 to rotate or not rotate.

Steering control system 206 includes at least one device configured to rotate one or more wheels of vehicle 200. In some examples, steering control system 206 includes at least one controller, actuator, and/or the like. In some embodiments, steering control system 206 causes the front two wheels and/or the rear two wheels of vehicle 200 to rotate to the left or right to cause vehicle 200 to turn to the left or right.

Brake system 208 includes at least one device configured to actuate one or more brakes to cause vehicle 200 to reduce speed and/or remain stationary. In some examples, brake system 208 includes at least one controller and/or actuator that is configured to cause one or more calipers associated with one or more wheels of vehicle 200 to close on a corresponding rotor of vehicle 200. Additionally, or alternatively, in some examples brake system 208 includes an automatic emergency braking (AEB) system, a regenerative braking system, and/or the like.

In some embodiments, vehicle 200 includes at least one platform sensor (not explicitly illustrated) that measures or infers properties of a state or a condition of vehicle 200. In some examples, vehicle 200 includes platform sensors such as a global positioning system (GPS) receiver, an inertial measurement unit (IMU), a wheel speed sensor, a wheel brake pressure sensor, a wheel torque sensor, an engine torque sensor, a steering angle sensor, and/or the like.

Referring now to FIG. 3, illustrated is a schematic diagram of a device 300. As illustrated, device 300 includes processor 304, memory 306, storage component 308, input interface 310, output interface 312, communication interface 314, and bus 302. In some embodiments, device 300 corresponds to at least one device of vehicles 102 (e.g., at least one device of a system of vehicles 102), and/or one or more devices of network 112 (e.g., one or more devices of a system of network 112). In some embodiments, one or more devices of vehicles 102 (e.g., one or more devices of a system of vehicles 102), and/or one or more devices of network 112 (e.g., one or more devices of a system of network 112) include at least one device 300 and/or at least one component of device 300. As shown in FIG. 3, device 300 includes bus 302, processor 304, memory 306, storage component 308, input interface 310, output interface 312, and communication interface 314.

Bus 302 includes a component that permits communication among the components of device 300. In some embodiments, processor 304 is implemented in hardware, software, or a combination of hardware and software. In some examples, processor 304 includes a processor (e.g., a central processing unit (CPU), a graphics processing unit (GPU), an accelerated processing unit (APU), and/or the like), a microphone, a digital signal processor (DSP), and/or any processing component (e.g., a field-programmable gate array (FPGA), an application specific integrated circuit (ASIC), and/or the like) that can be programmed to perform at least one function. Memory 306 includes random access memory (RAM), read-only memory (ROM), and/or another type of dynamic and/or static storage device (e.g., flash memory, magnetic memory, optical memory, and/or the like) that stores data and/or instructions for use by processor 304.

Storage component 308 stores data and/or software related to the operation and use of device 300. In some examples, storage component 308 includes a hard disk (e.g., a magnetic disk, an optical disk, a magneto-optic disk, a solid state disk, and/or the like), a compact disc (CD), a digital versatile disc (DVD), a floppy disk, a cartridge, a magnetic tape, a CD-ROM, RAM, PROM, EPROM, FLASH-EPROM, NV-RAM, and/or another type of computer readable medium, along with a corresponding drive.

Input interface 310 includes a component that permits device 300 to receive information, such as via user input (e.g., a touchscreen display, a keyboard, a keypad, a mouse, a button, a switch, a microphone, a camera, and/or the like). Additionally or alternatively, in some embodiments input interface 310 includes a sensor that senses information (e.g., a global positioning system (GPS) receiver, an accelerometer, a gyroscope, an actuator, and/or the like). Output interface 312 includes a component that provides output information from device 300 (e.g., a display, a speaker, one or more light-emitting diodes (LEDs), and/or the like).

In some embodiments, communication interface 314 includes a transceiver-like component (e.g., a transceiver, a separate receiver and transmitter, and/or the like) that permits device 300 to communicate with other devices via a wired connection, a wireless connection, or a combination of wired and wireless connections. In some examples, communication interface 314 permits device 300 to receive information from another device and/or provide information to another device. In some examples, communication interface 314 includes an Ethernet interface, an optical interface, a coaxial interface, an infrared interface, a radio frequency (RF) interface, a universal serial bus (USB) interface, a Wi-Fi® interface, a cellular network interface, and/or the like.

In some embodiments, device 300 performs one or more processes described herein. Device 300 performs these processes based on processor 304 executing software instructions stored by a computer-readable medium, such as memory 305 and/or storage component 308. A computer-readable medium (e.g., a non-transitory computer readable medium) is defined herein as a non-transitory memory device. A non-transitory memory device includes memory space located inside a single physical storage device or memory space spread across multiple physical storage devices.

In some embodiments, software instructions are read into memory 306 and/or storage component 308 from another computer-readable medium or from another device via communication interface 314. When executed, software instructions stored in memory 306 and/or storage component 308 cause processor 304 to perform one or more processes described herein. Additionally or alternatively, hardwired circuitry is used in place of or in combination with software instructions to perform one or more processes described herein. Thus, embodiments described herein are not limited to any specific combination of hardware circuitry and software unless explicitly stated otherwise.

Memory 306 and/or storage component 308 includes data storage or at least one data structure (e.g., a database and/or the like). Device 300 is capable of receiving information from, storing information in, communicating information to, or searching information stored in the data storage or the at least one data structure in memory 306 or storage component 308. In some examples, the information includes network data, input data, output data, or any combination thereof.

In some embodiments, device 300 is configured to execute software instructions that are either stored in memory 306 and/or in the memory of another device (e.g., another device that is the same as or similar to device 300). As used herein, the term "module" refers to at least one instruction stored in memory 306 and/or in the memory of another device that, when executed by processor 304 and/or by a processor of another device (e.g., another device that is the same as or similar to device 300) cause device 300 (e.g., at least one component of device 300) to perform one or more processes described herein. In some embodiments, a module is implemented in software, firmware, hardware, and/or the like.

The number and arrangement of components illustrated in FIG. 3 are provided as an example. In some embodiments, device 300 can include additional components, fewer components, different components, or differently arranged components than those illustrated in FIG. 3. Additionally or alternatively, a set of components (e.g., one or more components) of device 300 can perform one or more functions described as being performed by another component or another set of components of device 300.

Figure 4:
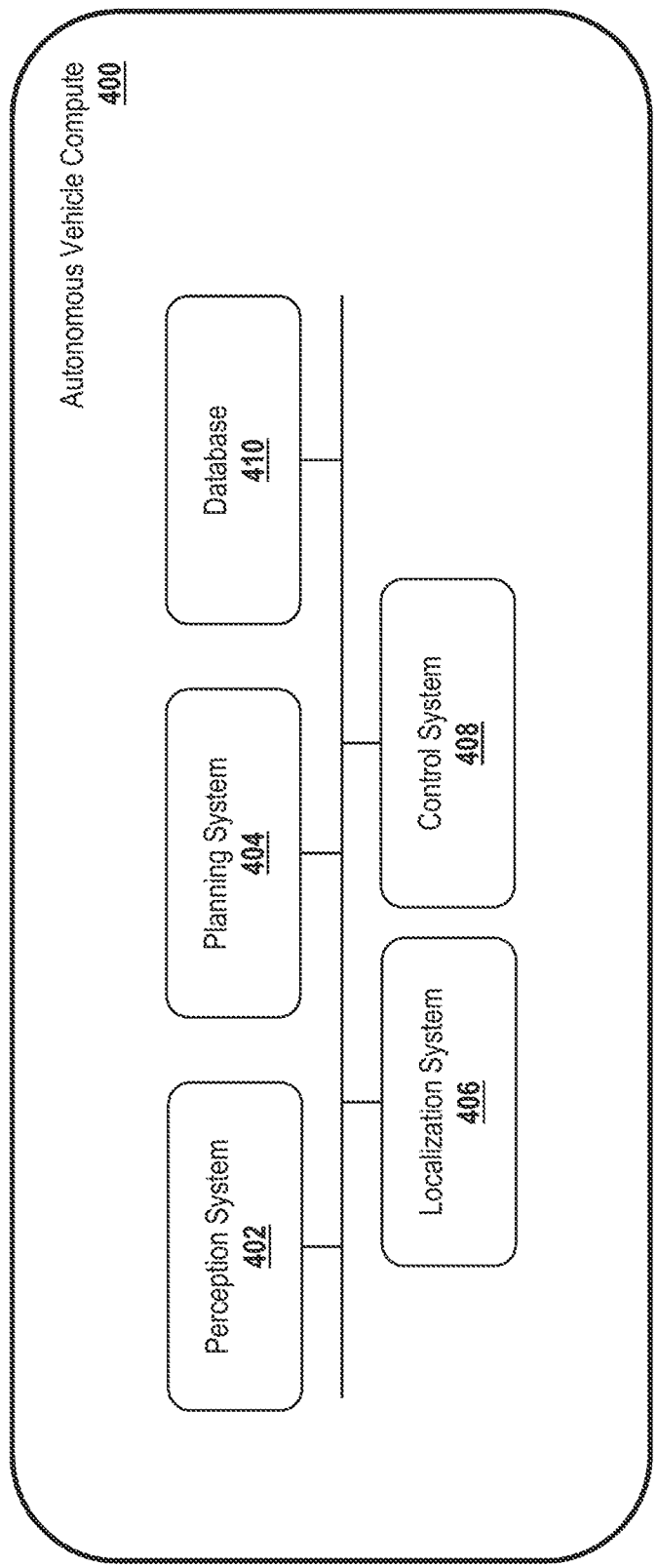
FIG. 4 is a diagram of certain components of an autonomous system.

Referring now to FIG. 4, illustrated is an example block diagram of an autonomous vehicle compute 400 (sometimes referred to as an "AV stack"). As illustrated, autonomous vehicle compute 400 includes perception system 402 (sometimes referred to as a perception module), planning system 404 (sometimes referred to as a planning module), localization system 406 (sometimes referred to as a localization module), control system 408 (sometimes referred to as a control module), and database 410. In some embodiments, perception system 402, planning system 404, localization system 406, control system 408, and database 410 are included and/or implemented in an autonomous navigation system of a vehicle (e.g., autonomous vehicle compute 202f of vehicle 200). Additionally, or alternatively, in some embodiments perception system 402, planning system 404, localization system 406, control system 408, and database 410 are included in one or more standalone systems (e.g., one or more systems that are the same as or similar to autonomous vehicle compute 400 and/or the like). In some examples, perception system 402, planning system 404, localization system 406, control system 408, and database 410 are included in one or more standalone systems that are located in a vehicle and/or at least one remote system as described herein. In some embodiments, any and/or all of the systems included in autonomous vehicle compute 400 are implemented in software (e.g., in software instructions stored in memory), computer hardware (e.g., by microprocessors, microcontrollers, application-specific integrated circuits [ASICs], Field Programmable Gate Arrays (FPGAs), and/or the like), or combinations of computer software and computer hardware. It will also be understood that, in some embodiments, autonomous vehicle compute 400 is configured to be in communication with a remote system (e.g., an autonomous vehicle system that is the same as or similar to remote AV system 114, a fleet management system 116 that is the same as or similar to fleet management system 116, a V2I system that is the same as or similar to V2I system 118, and/or the like).

In some embodiments, perception system 402 receives data associated with at least one physical object (e.g., data that is used by perception system 402 to detect the at least one physical object) in an environment and classifies the at least one physical object. In some examples, perception system 402 receives image data captured by at least one camera (e.g., cameras 202a), the image associated with (e.g., representing) one or more physical objects within a field of view of the at least one camera. In such an example, perception system 402 classifies at least one physical object based on one or more groupings of physical objects (e.g., bicycles, vehicles, traffic signs, pedestrians, and/or the like). In some embodiments, perception system 402 transmits data associated with the classification of the physical objects to planning system 404 based on perception system 402 classifying the physical objects.

In some embodiments, planning system 404 receives data associated with a destination and generates data associated with at least one route (e.g., routes 106) along which a vehicle (e.g., vehicles 102) can travel along toward a destination. In some embodiments, planning system 404 periodically or continuously receives data from perception system 402 (e.g., data associated with the classification of physical objects, described above) and planning system 404 updates the at least one trajectory or generates at least one different trajectory based on the data generated by perception system 402. In some embodiments, planning system 404 receives data associated with an updated position of a vehicle (e.g., vehicles 102) from localization system 406 and planning system 404 updates the at least one trajectory or generates at least one different trajectory based on the data generated by localization system 406.

In some embodiments, localization system 406 receives data associated with (e.g., representing) a location of a vehicle (e.g., vehicles 102) in an area. In some examples, localization system 406 receives LiDAR data associated with at least one point cloud generated by at least one LiDAR sensor (e.g., LiDAR sensors 202b). In certain examples, localization system 406 receives data associated with at least one point cloud from multiple LiDAR sensors and localization system 406 generates a combined point cloud based on each of the point clouds. In these examples, localization system 406 compares the at least one point cloud or the combined point cloud to two-dimensional (2D) and/or a three-dimensional (3D) map of the area stored in database 410. Localization system 406 then determines the position of the vehicle in the area based on localization system 406 comparing the at least one point cloud or the combined point cloud to the map. In some embodiments, the map includes a combined point cloud of the area generated prior to navigation of the vehicle. In some embodiments, maps include, without limitation, high-precision maps of the roadway geometric properties, maps describing road network connectivity properties, maps describing roadway physical properties (such as traffic speed, traffic volume, the number of vehicular and cyclist traffic lanes, lane width, lane traffic directions, or lane marker types and locations, or combinations thereof), and maps describing the spatial locations of road features such as crosswalks, traffic signs or other travel signals of various types. In some embodiments, the map is generated in real-time based on the data received by the perception system.

In another example, localization system 406 receives Global Navigation Satellite System (GNSS) data generated by a global positioning system (GPS) receiver. In some examples, localization system 406 receives GNSS data associated with the location of the vehicle in the area and localization system 406 determines a latitude and longitude of the vehicle in the area. In such an example, localization system 406 determines the position of the vehicle in the area based on the latitude and longitude of the vehicle. In some embodiments, localization system 406 generates data associated with the position of the vehicle. In some examples, localization system 406 generates data associated with the position of the vehicle based on localization system 406 determining the position of the vehicle. In such an example, the data associated with the position of the vehicle includes data associated with one or more semantic properties corresponding to the position of the vehicle.

In some embodiments, control system 408 receives data associated with at least one trajectory from planning system 404 and control system 408 controls operation of the vehicle. In some examples, control system 408 receives data associated with at least one trajectory from planning system 404 and control system 408 controls operation of the vehicle by generating and transmitting control signals to cause a powertrain control system (e.g., DBW system 202h, powertrain control system 204, and/or the like), a steering control system (e.g., steering control system 206), and/or a brake system (e.g., brake system 208) to operate. In an example, where a trajectory includes a left turn, control system 408 transmits a control signal to cause steering control system 206 to adjust a steering angle of vehicle 200, thereby causing vehicle 200 to turn left. Additionally, or alternatively, control system 408 generates and transmits control signals to cause other devices (e.g., headlights, turn signal, door locks, windshield wipers, and/or the like) of vehicle 200 to change states.

In some embodiments, perception system 402, planning system 404, localization system 406, and/or control system 408 implement at least one machine learning model (e.g., at least one multilayer perceptron (MLP), at least one convolutional neural network (CNN), at least one recurrent neural network (RNN), at least one autoencoder, at least one transformer, and/or the like). In some examples, perception system 402, planning system 404, localization system 406, and/or control system 408 implement at least one machine learning model alone or in combination with one or more of the above-noted systems. In some examples, perception system 402, planning system 404, localization system 406, and/or control system 408 implement at least one machine learning model as part of a pipeline (e.g., a pipeline for identifying one or more objects located in an environment and/or the like).

Database 410 stores data that is transmitted to, received from, and/or updated by perception system 402, planning system 404, localization system 406 and/or control system 408. In some examples, database 410 includes a storage component (e.g., a storage component that is the same as or similar to storage component 308 of FIG. 3) that stores data and/or software related to the operation and uses at least one system of autonomous vehicle compute 400. In some embodiments, database 410 stores data associated with 2D and/or 3D maps of at least one area. In some examples, database 410 stores data associated with 2D and/or 3D maps of a portion of a city, multiple portions of multiple cities, multiple cities, a county, a state, a State (e.g., a country), and/or the like. In such an example, a vehicle (e.g., a vehicle that is the same as or similar to vehicles 102 and/or vehicle 200) can drive along one or more drivable regions (e.g., single-lane roads, multi-lane roads, highways, back roads, off road trails, and/or the like) and cause at least one LiDAR sensor (e.g., a LiDAR sensor that is the same as or similar to LiDAR sensors 202b) to generate data associated with an image representing the objects included in a field of view of the at least one LiDAR sensor.

In some embodiments, database 410 can be implemented across a plurality of devices. In some examples, database 410 is included in a vehicle (e.g., a vehicle that is the same as or similar to vehicles 102 and/or vehicle 200), an autonomous vehicle system (e.g., an autonomous vehicle system that is the same as or similar to remote AV system 114, a fleet management system (e.g., a fleet management system that is the same as or similar to fleet management system 116 of FIG. 1, a V2I system (e.g., a V2I system that is the same as or similar to V2I system 118 of FIG. 1) and/or the like.

Figure 5:
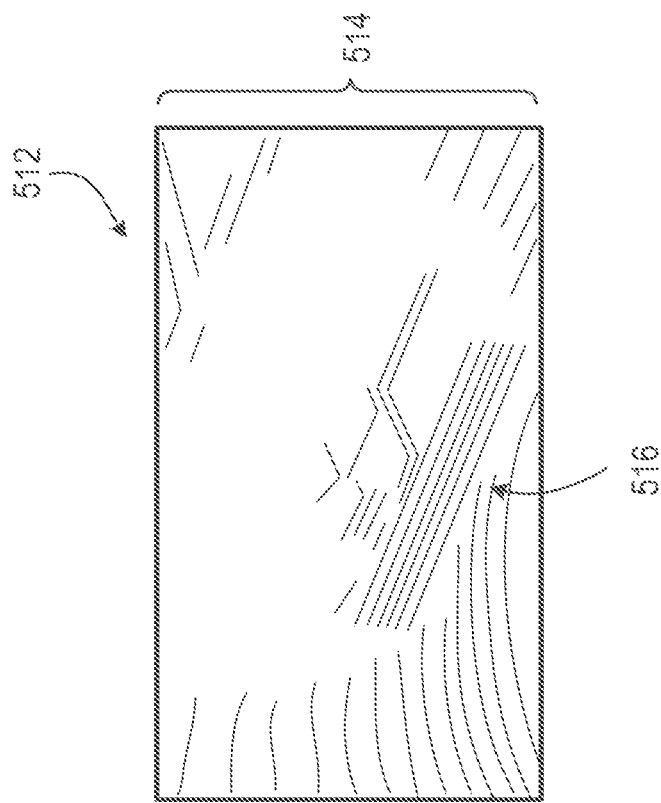
FIG. 5 shows an example of a LiDAR system.
Figure 5:
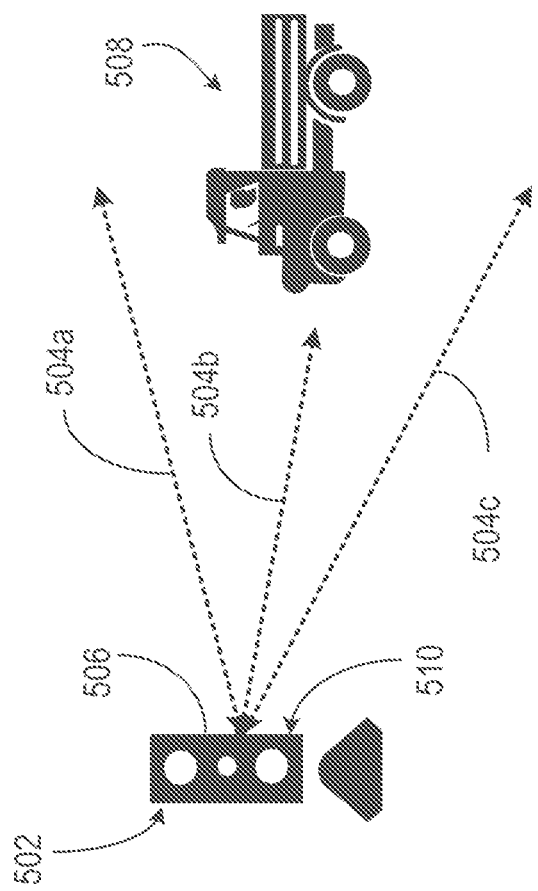

FIG. 5 shows an example of a LiDAR system 502. The LiDAR system 502 emits light 504a-c from one or more light emitters 506 (e.g., laser transmitter). Light emitted by a LiDAR system is typically not in the visible spectrum; for example, infrared is often used. Some of the light 504b emitted encounters a physical object 508 (e.g., a vehicle) and reflects back to the LiDAR system 502. The LiDAR system 502 also has one or more light detectors 510 (e.g. photodiode, pin photodiode, APD, and SiPM), which detect the reflected light. In an embodiment, one or more data processing systems associated with the LiDAR system generates an image 512 representing the field of view 514 of the LiDAR system. The image 512 includes information that represents the boundaries and reflectivity 516 of a physical object 508. In this way, the image 512 is used to determine the boundaries 516 of one or more physical objects near an AV.

Figure 6:
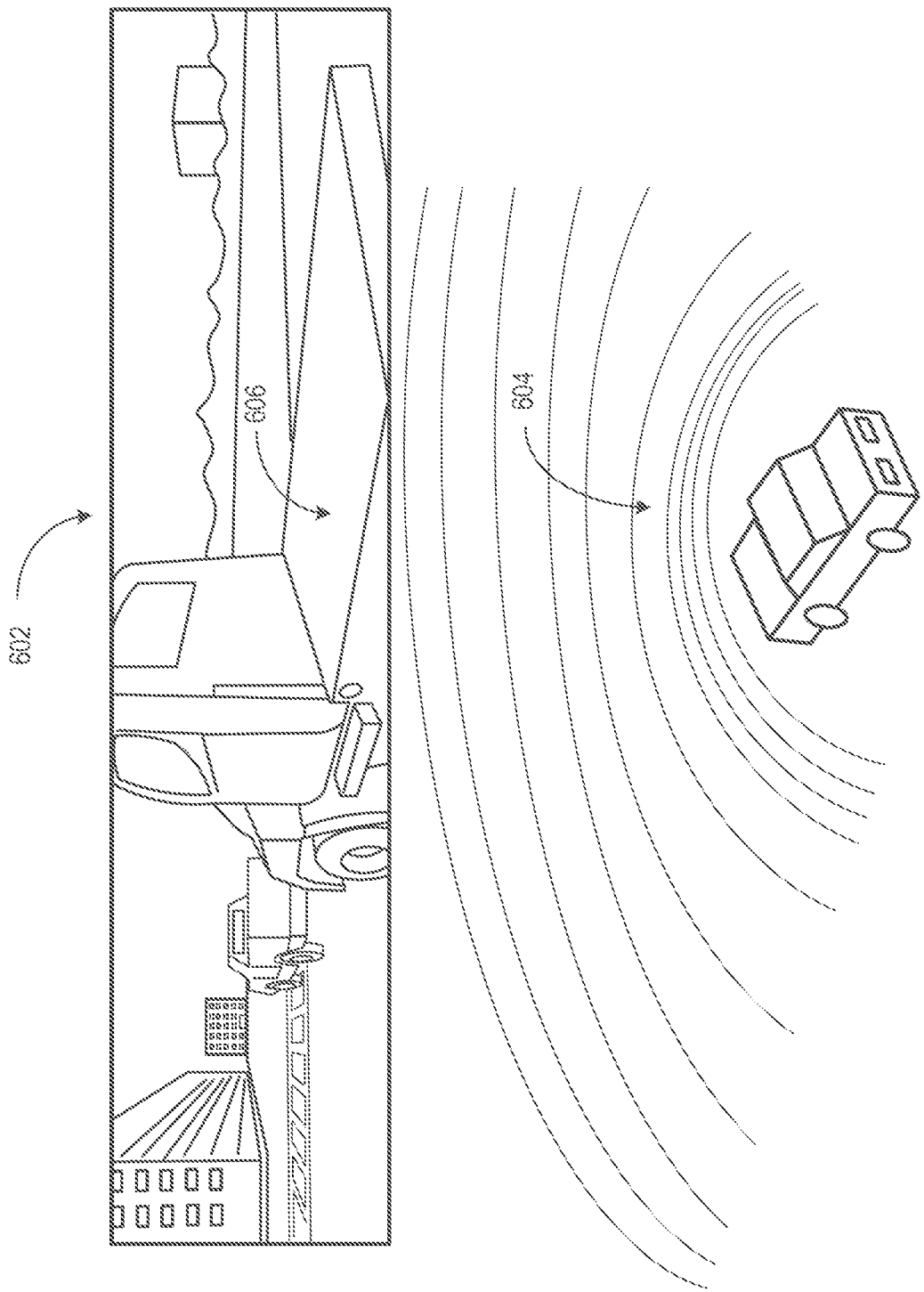
FIG. 6 shows the LiDAR system in operation.

FIG. 6 shows the LiDAR system 502 in operation. In the example of FIG. 6, the vehicle 102 receives both camera system output in the form of an image 602 and LiDAR system output in the form of LiDAR data points 604. In use, the data processing systems of the vehicle 102 compares the image 602 to the data points 604. In particular, a physical object 606 identified in the image 602 is also identified among the data points 604. In this way, the vehicle 102 perceives the boundaries of the physical object based on the contour and density of the data points 604.

Figure 7:
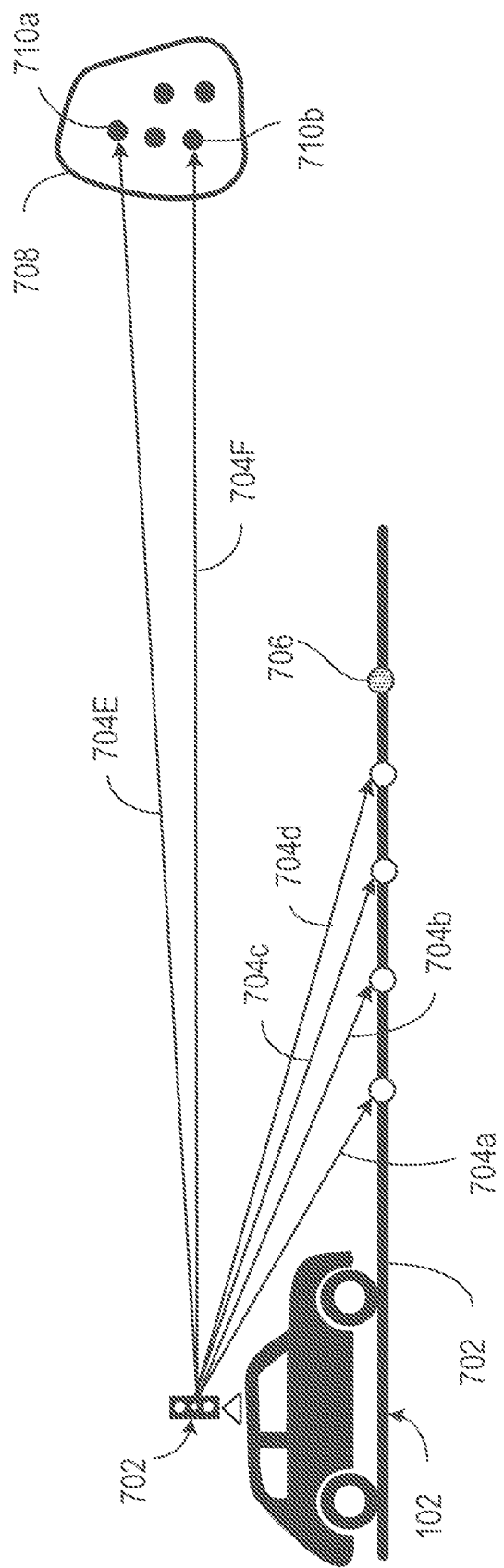
FIG. 7 shows the operation of the LiDAR system in additional detail.

FIG. 7 shows the operation of the LiDAR system 502 in additional detail. As described above, the vehicle 102 detects the boundary and reflectivity of a physical object based on characteristics of the data points detected by the LiDAR system 502. As shown in FIG. 7, a flat object, such as the ground 702, will reflect light 704a-d emitted from a LiDAR system 502 in a consistent manner. As the vehicle 102 travels over the ground 702, the LiDAR system 502 will continue to detect light reflected by the next valid ground point 706 if nothing is obstructing the road. However, if an object 708 obstructs the road, light 704e-f emitted by the LiDAR system 502 will be reflected from points 710a-b in a manner inconsistent with the expected consistent manner. From this information, the vehicle 102 can determine that the object 708 is present.

Automotive time-of-flight (ToF) LiDAR systems use laser signals to determine the speed and distance of stationary and moving objects (e.g., other vehicles, pedestrians, obstacles). LiDAR systems compare emitted transmit signals to reflected return signals to make these measurements. In some embodiments, a silicon photomultiplier (SiPM) is used as photodetector (receiver) that detects the reflected return signals. In an embodiment, the SiPM based LiDAR is a pulsed LiDAR system with a modified pulse (peak power) width of individual pulses that outputs at least one output pulse. For example, a LiDAR emits a train of pulses and the width of individual pulses is modified (e.g. 1st pulse: 25 W&1 ns and 2nd pulse: 5 W&5 ns). In some embodiments, a bandpass filter (e.g., 500 MHz-5 GHz) is applied to the SiPM output (e.g. anode output, or individual single-photon avalanche diode (SPAD) output). In some embodiments, the width of a saturation plateau of an output pulse is monitored by readout circuitry (e.g. 1-5 GHz ADC or 10-100 ps resolution TDC).

Figure 8:
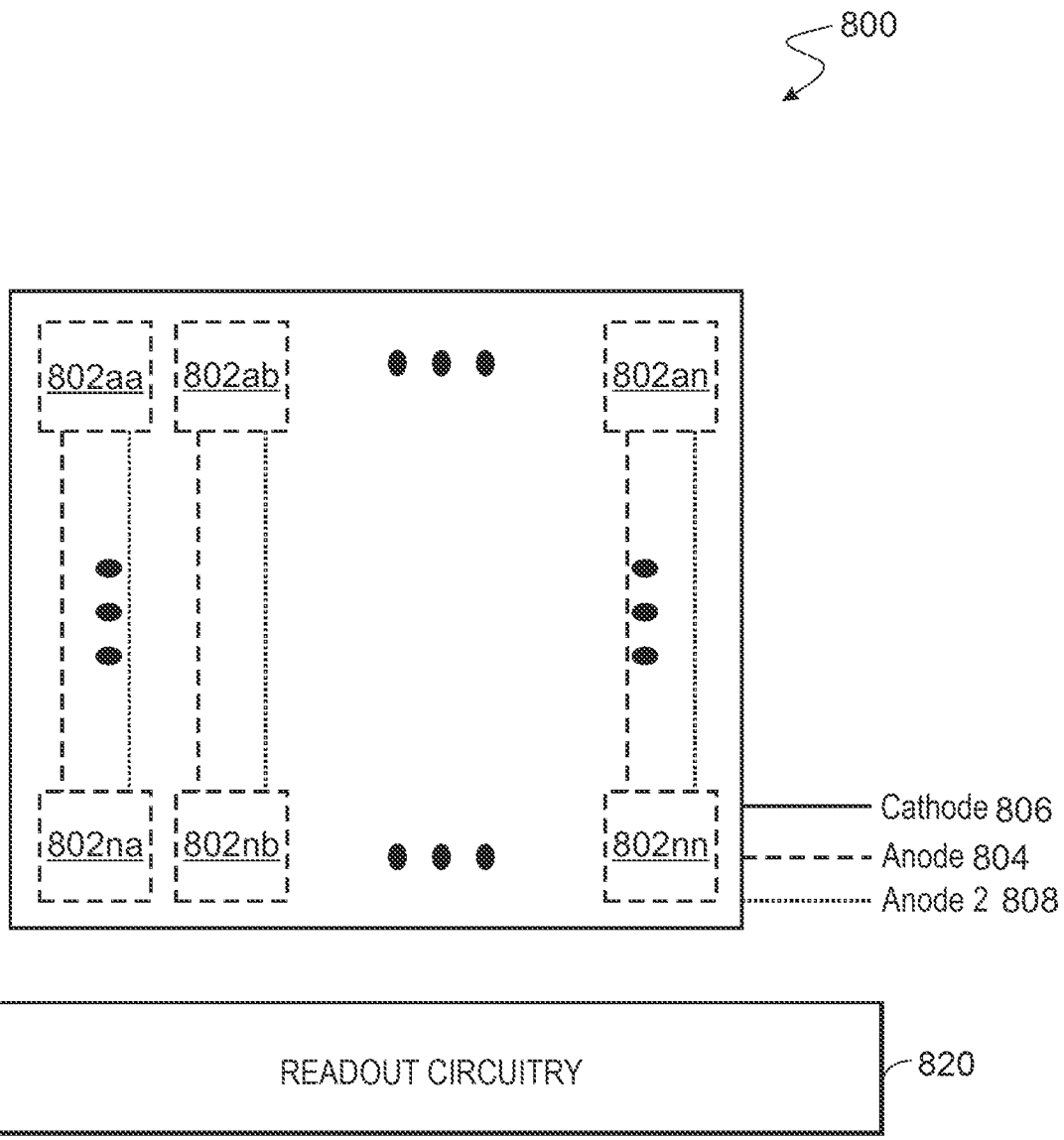
FIG. 8 is a diagram of a silicon photomultiplier (SiPM) device.

FIG. 8 is a diagram of a silicon photomultiplier (SiPM) device 800 with a plurality of microcells 802aa-802an (referred to individually as microcell 802 and collectively as microcells 802). In some embodiments, the device 800 is implemented (e.g., completely, partially, etc.) in a vehicle that is the same as or similar to vehicles 102, described in reference to FIG. 11. In some embodiments, the device 800 is implemented (e.g., completely, partially, etc.) as LIDAR sensors that are the same as or similar to LiDAR sensors 202b described in reference to FIG. 2. In some embodiments, the device 800 is implemented (e.g., completely, partially, etc.) in a LiDAR system that is the same as or similar to LiDAR system 502, described in reference to FIGS. 5-7. In some embodiments, the device 800 captures information for processing by an autonomous vehicle compute, such as the autonomous vehicle compute 400 (e.g., perception system 402, planning system 404, localization system 406, control system 408, and database 410) described in reference to FIG. 4.

In some embodiments, the SiPM device 800 is a pixelated photodetector that senses, times, and quantifies low-light signals down to the single-photon level. The SiPM device 800 includes a number of microcells 802 in an array that share a common output, cathode 806. In the example of FIG. 8, each device 800 includes a first anode 804 and a cathode 806. Each microcell 802 is a series combination of a single photon avalanche photodiode (SPAD) and a quenching resistor. A SPAD detects single photons, providing short duration trigger pulses that can be counted. A photodiode operated in Geiger mode employs a mechanism of breakdown to achieve a high gain and is referred to as a SPAD. SPADs are also used to obtain the time of arrival of the incident photon due to the high speed that the avalanche builds up and the SPADs' low timing jitter. A SPAD is biased well above its reverse-bias breakdown voltage and has a structure that enables operation without damage or undue noise.

In the example of FIG. 8, the microcells 802 are connected in parallel and share a common output or anode 804. Accordingly, the resulting a SiPM device has an anode 804 and a cathode 806. The microcells 802 are able to detect single photons providing short duration current pulse. In examples, the anode 804 outputs a current pulse that is synchronous with the photon arrival time. Each microcell 802 detects photons independently. When a photon is detected by a microcell, an electron hole pair is created. When a sufficiently high electric field is generated within the depletion region, the charge carrier (electron or hole) created there will be accelerated to carry sufficient kinetic energy to create secondary electron-hole pairs (impact ionization). A macroscopic (avalanche) current is passed through the microcell until the microcell is quenched by passive quenching (e.g. the quenching resistor) or active circuitry. The sum of the currents from each of fired microcell is combined to form a pseudo-analog output (a chronological superposition of current pulses of fired microcells) that is used to calculate the magnitude of a photon flux. Quenching lowers a reverse voltage applied to the SiPM to a value below its breakdown voltage, thus halting the avalanche of current. The SiPM then recharges back to a bias voltage, and is available to detect subsequent photons. For example, the intensity of the captured reflections is output by the anode 804, where a number of output pulses from the microcells are accumulated within a predefined time period.

In an embodiment, the SiPM can be variant, e.g. including a third terminal, a second anode 808, in addition to the anode 804 and cathode 806. The third terminal may be referred to as a fast output, and is connected to individual microcells with passive or active readout circuitry (e.g. capacitor) in response to the detection of a single photon. Accordingly, the fast output is capacitively coupled to each microcell 802. The fast output at the second anode 808, like the anode-cathode output, is formed from the sum of all microcells. In some embodiments, the fast output or anode 808 has a lower output capacitance when compared to the output capacitance of the anode 804. In some embodiments, the second anode 808 is used to make fast timing measurements, including the timing information captured as described below.

In embodiments, the anode 804 produces an output pulse (e.g., current) in response to photons detected at microcells 802, and captures reflections at various light levels, such as low light level (e.g., less than 100 photons) signals and high light level (e.g., substantially greater than 100 photons) signals. Saturation occurs at a high flux as microcells by the gradual triggered of microcells during a process of optical power detection (e.g., typically optical power width of 1-10 nanoseconds). As the number of photons increases, the current output by anode 804 begins to saturate. At high light levels, all microcells are simultaneously fired and the saturation of the microcells 802 prevents reliable output from the anode 804. In embodiments, timing information and intensity information associated with the output pulse is used to extrapolate accurate output values when the SIPM device is saturated. In examples, the extrapolated output includes a portion of the output pulse undetected or lost during saturation of the device 800. In some embodiments, the extrapolated information corresponds to the time during which a saturation plateau occurs.

For ease of description, the microcells are illustrated as being of a same size and arranged in a rectangular pattern. However, the microcells according to the present techniques can be of any size and shape. For example, depending on the implementation, the size of a microcell varies from 1 µm to 100 µm and the number of microcells per device ranges from several hundred to several tens of thousands. In examples, the SiPM pixel 800 is a series combination of a single SPAD and a quenching resistor or quenching circuit. Typically, the low return light signal is reflected from an object at a long distance, while a high return signal is reflected from a near-range object. The SPADs (microcells) are connected in parallel, and each microcell detects photons independently. In examples, reflections observed by the SiPM microcells are summed to generate an output signal.

In examples, readout circuitry 820 includes an external circuit that calculates the optical power of the output signal (e.g. peak, area, and shape of the analog signal) and the arrival time (e.g. measuring the time of the rising edge of the SiPM output) associated with the captured information. For example, an external circuit calculates the optical power of the reflected light by measuring the analog signal. In an embodiment, the external circuit counts the number of fired microcells (e.g. active SiPM pixels). In an embodiment, the external circuit measures the start time of the pulse output by the pixels to obtain the arrival time of the photon. The dynamic range of the SiPM device is based on the number of microcells, which fundamentally limit the intensity/reflectivity accuracy. In examples, LIDAR systems (e.g., LiDAR system 502 of FIG. 5) employ monochromatic laser pulses and can measure both the intensity and time delay of the reflected laser pulse (e.g., return signal). From the intensity and time delay, the LIDAR system can then generate a LIDAR image comprising an array of LIDAR data points (e.g., LIDAR data points 604), each data point including the range (distance from the LIDAR system) and reflectivity of a detected object in the field around the system. In embodiments, the LiDAR image is a point cloud.

The block diagram of FIG. 8 is not intended to indicate that the device 800 is to include all of the components shown in FIG. 8. Rather, the device 800 can include fewer or additional components not illustrated in FIG. 8 (e.g., additional microcells, anodes, cathodes, differently shaped microcells, etc.). The device 800 may include any number of additional components not shown, depending on the details of the specific implementation. Furthermore, portions of the device other described functionalities may be partially, or entirely, implemented in hardware and/or in a processor. For example, the control or functionality may be implemented with an application specific integrated circuit, in logic implemented in a processor, in logic implemented in a specialized graphics processing unit, or in any other device.

Figure 9:
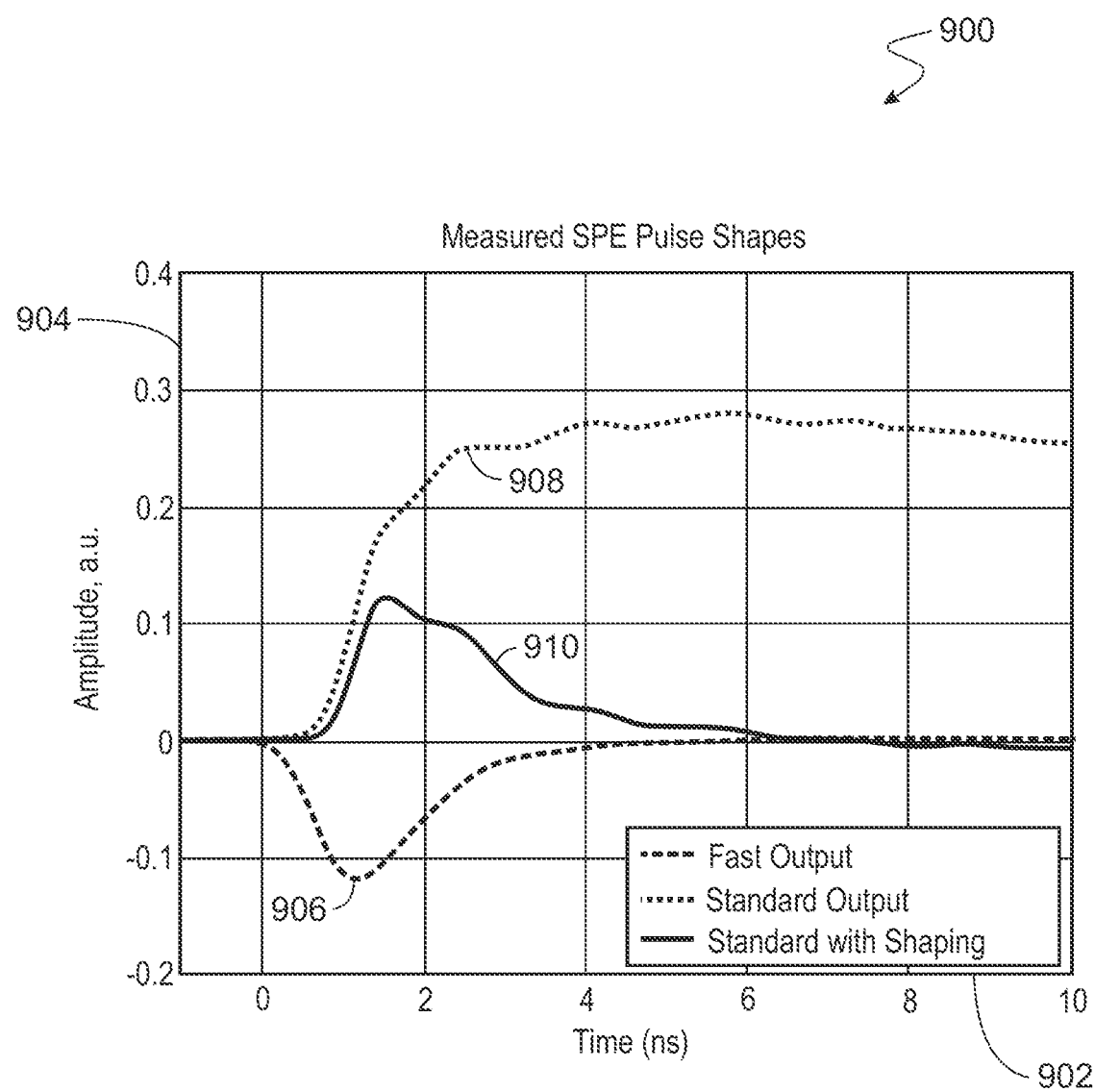
FIG. 9 is a graph of a SiPM device single photon-electron response at varying outputs.

FIG. 9 is a graph 900 of a SiPM device single photon-electron response at varying outputs. In some embodiments, the SiPM device used to generate the single photon-electron response at varying outputs is an SiPM device 800 described in reference to FIG. 9. As illustrated in the example of FIG. 9, time is plotted on the x-axis 902, and an amplitude is plotted on the y-axis 904. A response of an SiPM device (e.g., SiPM device 800 of FIG. 8) is captured at three outputs. A fast output 906 shows the response of individual microcells with passive or active readout circuitry (e.g. capacitor) in response to the detection of a single photon. In examples, the fast output is obtained at the second anode 808 described with respect to FIG. 8. A standard output 908 shows the response individual microcells in response to the detection of a single photon. In examples, the standard output 908 is obtained at the anode 804 described with respect to FIG. 8.

In FIG. 9, a standard output with shaping 910 shows a response that is shaped using a filter. In some embodiments, the SiPM device detects reflections and outputs an output pulse that is filtered by a filter (e.g. high-pass or bandpass filter). Filtering narrows the output pulse shape. Traditionally, the falling edge of a SiPM output pulse is 10-20 times longer than the rising edge. Without filtering, the falling edge of the output pulse dominates the output plus, and thus the information associated with the SiPM is unavailable during saturation. In examples, applying a band pass filter to the output pulses makes the output substantially symmetric, and the saturation of the SiPM may be resolved. In a substantially symmetric pulse, the falling edge is less than 10-20 times longer than the rising edge.

The present techniques increase the dynamic range of an SiPM device without requiring an increase in the number of microcells. For example, the SiPM device detects several photons (return optical power) that trigger microcells. In some embodiments, the optical power is proportional to SiPM output current. The SiPM readout is used to determine various properties associated with objects that caused the reflections. For example, position information of an object is determined by the triggering times of the microcells (e.g., the rising edge of SiPM output pulse). The reflectivity information of an object is determined by the shape of SiPM output pulse.

In some embodiments, the SiPM device produces a photocurrent proportional to the number of microcells that have been fired by incident photons. This photocurrent enables a measure of optical power received by the SiPM. In an embodiment, the photocurrent flows through the SiPM device from cathode to anode, and either of the cathode or anode terminals may be used as an output. In an embodiment, a fast path output with high pass filter may be derived from an individual microcell (e.g., SPAD). The output amplitude is proportional to the number of microcells that have fired and can therefore provide information on the number of photons detected.

Figure 10:
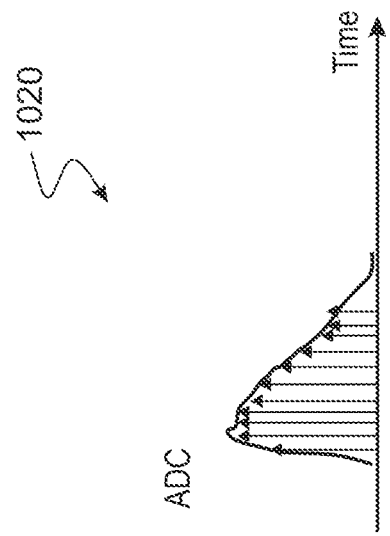
FIG. 10 is a diagram illustrating output pulses.
Figure 10:
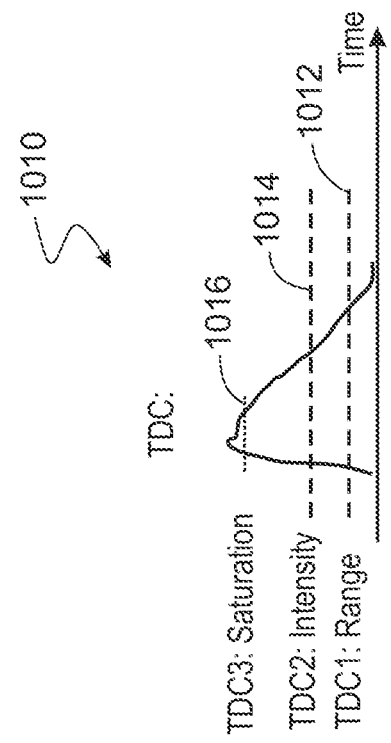

FIG. 10 is a diagram illustrating pulses 1010 and 1020. In some embodiments, the pulses 1010 and 1020 are obtained (e.g., completely, partially, etc.) from the device 800 described with respect to FIG. 8 (e.g., the output signal directly processed on-chip). In some embodiments, the pulses 1010 and 1020 are obtained from readout circuitry 820 of FIG. 8. In the example of FIG. 10, a pulse 1010 is generated using a time-to-digital converter to capture timing information associated with the captured signal. A pulse 1020 is generated using an analog to digital converter to capture timing information associated with the captured signal.

In some embodiments, when a high photon flux is received at the SiPM device, the output is saturated due to limited number of available microcells. For example, if the number of detected photons is close to or larger than the number of microcells in the SiPM device, the output of the SiPM device is saturated and the SiPM does not accurately output incoming photon intensity. Accordingly, in some embodiments, in order to enable accurate measurement of intensity SiPM device saturation is monitored. In examples, in response to saturation a width of a saturation plateau is determined. The width of the saturation plateau gives information to increase the dynamic range of the SiPM. In examples, the width of the saturation plateau refers to a length of time that an output pulse experiences saturation. The saturation is determined by the saturation monitor.

In some embodiments, at a high flux a narrow saturation plateau of the output pulse is observed since nearly all (e.g. typically amount to hundreds) microcells are triggered in a short time span (e.g. less than 1 nanosecond). In some embodiments, at a higher flux, a wide saturation plateau of the output pulse is observed as a majority of microcells in the SiPM device are triggered during optical power detection (e.g., typically an optical power width of 1-10 nanoseconds). The width of the saturation plateau is observed, and a length of time that the SiPM device is saturated is determined. The SiPM saturation time length is used to correct the non-linear output of the sensor.

In a TDC-based approach illustrated by pulse 1010, one or more predetermined intensity levels are established as thresholds. One or more TDCs measure the width of a saturation plateau of an output pulse when a high photon flux is received by the SiPM device. In the example of FIG. 10, levels 1012, 1014, and 1016 are used to determine timing information and intensity information associated with the output pulse 1010. The timing information and intensity information is used to extrapolate the output pulse information during saturation of the SiPM device. Similarly, in an ADC-based approach illustrated by pulse 1020, high speed and high bandwidth ADCs are implemented. In examples, a high speed (e.g. 1-5 GHz) ADC digitizes the output signal from the SiPM device. In some embodiments, predetermined intensity levels are established as thresholds and the SiPM device saturation width is monitored by the high speed ADC.

In the example of FIG. 10, the pulses 1010 and 1020 (e.g., SiPM readout) exhibit a fast rising edge with a relatively slower falling edge. In some embodiments, a rise time of the output pulse is determined by a rise time of the avalanche formation and the variation in the transit times of signals arriving from different points from the microcells of the SiPM device (e.g., microcells 802 of SiPM device 800 described with respect to FIG. 8). The recovery time of the microcells, or decay time of the pulse, is determined by an SiPM microcell recharge time constant.

Figure 11:
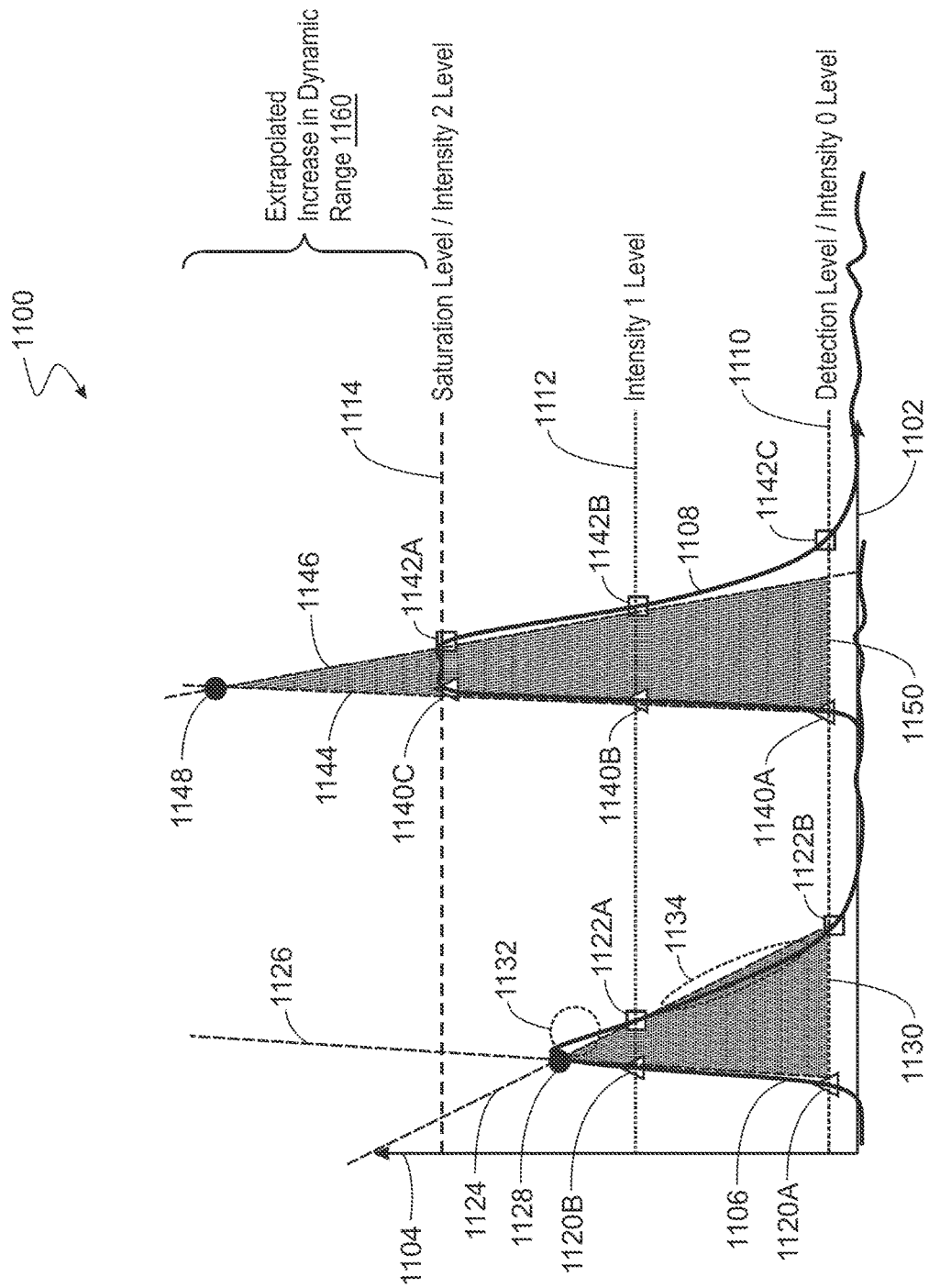
FIG. 11 is an illustration of pulses with increased dynamic range.

FIG. 11 is an illustration of pulses with increased dynamic range. In some embodiments, the pulses 1106 and 1108 are obtained (e.g., completely, partially, etc.) from the device 800 described with respect to FIG. 8 (e.g., the output signal directly processed on-chip). In some embodiments, the pulses 1106 and 1108 are obtained from readout circuitry 820 of FIG. 8. In the example of FIG. 11, a width of the output pulses 1106 and 1108 varies in response to modified pulses emitted by an emitter. For example, a LiDAR emits a train of pulses and the width of individual pulses is modified (e.g. 1st pulse: 25 W&1 ns and 2nd pulse: 5 W&5 ns).

In the example of FIG. 11, time is represented on the horizontal axis 1102, microvolts are represented on the vertical axis 1104. In some embodiments, the present techniques capture the character of the waveform of the response features of the two different types of readout pulses, such as the TDC pulse 1010 and the ADC pulse 1020 described with respect to FIG. 10. The response features (e.g., predetermined intensity levels) are thresholds applied to output pulses to identify and expand the dynamic range of the sensor. In some embodiments, the pulses are filtered prior to the applying thresholds to the output pulses. For example, a filter is applied to pulses that are wide and asymmetric to obtain a narrower and more symmetric pulse.

For ease of description, the predetermined intensity levels are described with respect to a TDC-based readout. However, the predetermined intensity levels can be established using other readout types (e.g., ADC). Additionally, for ease of description, the present techniques are described using a three intensity levels. However, the present techniques are not limited to three levels. In some embodiments, additional levels increase the accuracy of the extrapolated dynamic range.

In the example of FIG. 11, three intensity levels are illustrated. The intensity levels include a detection level 1110. At the detection level 1110, the smallest number of photons are captured. Intensity is at a zero level at the detection level 1110. At the detection level 1112, the number of photons captured is greater than the detection level 1110 and less than a saturation level 1114. In examples, there are any number of detection levels corresponding to predetermined intensity levels greater than the detection level 1110 and less than a saturation level 1114. At the saturation level 1114, the number of photons causes saturation of the SiPM device. Traditionally, information from the output pulse is unreliable when the device is saturated. In some embodiments, any number of predetermined intensity levels can be used, and the intensity levels are not limited to even spacing long within the range of intensity levels. In examples, the intensity levels are spaced according to other predetermined spacing, such as a log scale.

The intensity levels enable threshold values to be defined, at which timing information is obtained. As the pulse crosses the threshold values (on both the rising edge and the falling edge), it provides information used for extrapolation. For example, a TDC captures information at each level, such as the pulse crossed a predetermined intensity level at a certain time. In some embodiments, multiple TDCs are used to obtain timing and intensity information at multiple predetermined levels.

In some embodiments, a detection event occurs when a predetermined level is reached by a rising or falling edge of the output pulse. The event occurring at a predetermined intensity level enables a determination of the time and the range associated with the pulse. The pulse also has additional information, such as the intensity of return signal. The present techniques enable the calculation of the range and intensity information returned when sensor is saturated using extrapolation.

Extrapolation is done by fitting lines to the rising and falling edges of an output pulse. The extrapolated pulse is based on integrated pulse energy. The extrapolated calculation of output pulse data results in an increase in dynamic range 1160 beyond the limitations of the physical hardware. In some embodiments, the increase in dynamic range is calculated by determining the area of a polygon (e.g., trapezoid) formed from intersecting lines fit to the rising and falling edges of the output pulse. The TDC effectively samples places along a filtered output pulse according to the predetermined intensity levels. Traditionally, when an SiPM device is saturated, no information is known about the photon flux beyond the dynamic range of the device. In the example of FIG. 11, points are samples with the TDC at the points along the output pulse, marked by squares and triangles. In an embodiment, the dynamic range is extended through signal processing.

In the example of FIG. 11, the output pulse 1106 is an output of a fast anode, such as fast anode 806 of FIG. 8. The output pulse 1106 has an amplitude that crosses the detection level 1110 and detection level 1112. However, the output pulse 1106 peaks below the saturation level 1114. This results in timing and intensity information being captured at two levels: along the rising edge and falling edge of the output pulse 1106. Points along the rising edge of the pulse are illustrated with triangles; points along the falling edge are illustrated with squares. Along the rising edge of the output pulse 1106, timing information and intensity information are obtained as the edge of the pulse crosses detection level 1110 at point 1120A, and as the edge of the pulse crosses detection level 1112 at point 1120B. Similarly, along the falling edge of the output pulse 1106, timing information and intensity information are obtained as the edge of the pulse crosses detection level 1112 at point 1122A, and as the edge of the pulse 1106 crosses detection level 1110 at point 1122B. Using the timing and intensity information captured at points 1120A, 1120B, 1122A, and 1122B, in the event of saturation (e.g., low flux saturation, below the point of physical saturation), extrapolation is used to determine the complete output pulse that would be captured but for physical limitations of the SiPM device (e.g., too few microcells, damaged microcells). As illustrated, a line 1124 is fit through points 1120A and 1120B along the rising edge of output pulse 1106. Similarly, a line 1126 is fit through points 1122A and 1122B along the falling edge of output pulse 1106. Extrapolation of the output pulse extends to the intersection of lines 1124 and 1126 at point 1128, illustrated with a black dot. In the event of saturation of the SiPM device, extrapolation of the output pulse 1106 using points 1120A, 1120B, 1122A, and 1122B results in a peak at point 1128. As shown in FIG. 11, the area 1130 under the intersecting lines 1124 and 1126 varies slightly from the output pulse 1106, resulting in error illustrated within the dashed areas 1132 and 1134. In some embodiments, the error is due to an asymmetric pulse shape of the pulse 1106 and the use of two points for interpolation per edge.

The output pulse 1108 has an amplitude that crosses the detection level 1110, detection level 1112, and saturation level 1114. This results in timing and intensity information being captured at three levels. Along the rising edge of the output pulse 1108, timing and intensity information is obtained as the edge of the pulse crosses detection level 1110 at point 1140A, as the edge of the pulse crosses detection level 1112 at point 1140B, and as the edge of the pulse crosses saturation level 1114 at point 1140C. Similarly, along the falling edge of the output pulse 1108, timing and intensity information is obtained as the edge of the pulse crosses saturation level 1114 at point 1142A, as the edge of the pulse crosses detection level 1112 at point 1142B, and as the edge of the pulse crosses detection level 1110 at point 1142C. Using the timing and intensity information captured at points 1140A, 1140B, 1140C, 1142A, 1142B and 1142B, in the event of physical saturation (e.g., high flux saturation, beyond the point of physical saturation), extrapolation is used to determine the complete output pulse that would be captured but for physical limitations of the SiPM device. As illustrated, a line 1144 is fit through points 1140A, 1140B, and 1140C along the rising edge of output pulse 1106. Similarly, a line 1146 is fit through points 1142A, 1142B and 1142C along the falling edge of output pulse 1108. The line is fit through the most linear portion of each edge. In the event of saturation of the SiPM device, extrapolation of the output pulse 1108 using points 1140A, 1140B, 1140C, 1142A, 1142B and 1142B results in the peak at point 1148 at the intersection of lines 1144 and 1146. As shown in FIG. 11, the area 1150 under the intersecting lines 1144 and 1146 largely matches the area under the output pulse 1108. As illustrated, the more intensity level thresholds used, the higher the accuracy of the extrapolation. Extrapolation using three points is more accurate than extrapolation using two points.

Figure 12:
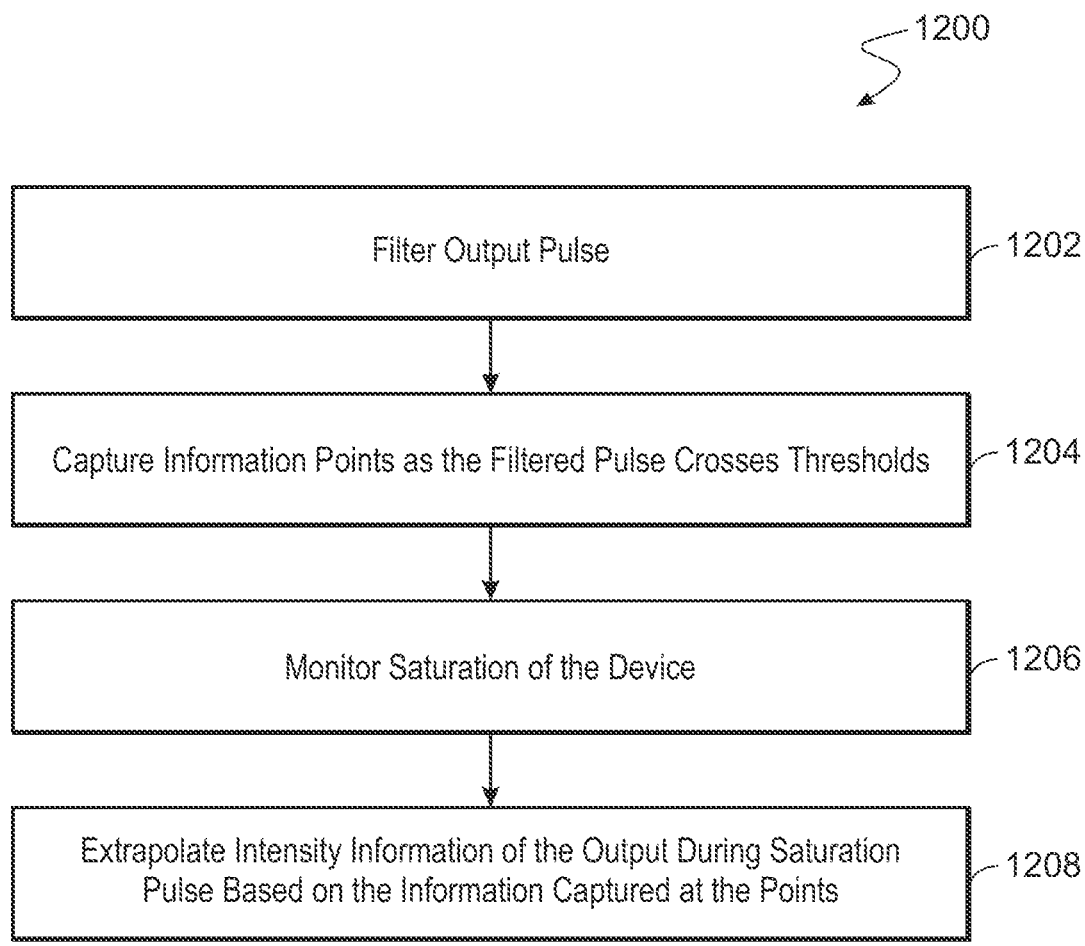
FIG. 12 is a process flow diagram of a process for extending the dynamic range of an SiPM device.

FIG. 12 is a process flow diagram of a process for extending the dynamic range of an SiPM device. In some embodiments, the process 1200 is implemented (e.g., completely, partially, etc.) using a system that is the same as or similar to remote AV system 114, fleet management system 116, and/or V2I system 118 described in reference to FIG. 1. In some embodiments, the process 1200 is implemented (e.g., completely, partially, etc.) using an AV system that is the same as or similar to autonomous system 202, described in reference to FIG. 2. In some embodiments, the process 1200 is implemented (e.g., completely, partially, etc.) using a device that is the same as or similar to device 300, described in reference to FIG. 3. In some embodiments, the process 1200 is implemented (e.g., completely, partially, etc.) using a system that is the same as or similar to autonomous vehicle compute 400, described in reference to FIG. 4. In some embodiments, the process 1200 is implemented using any of the above-noted systems in cooperation with one another.

At block 1202, an output pulse is filtered. In some embodiments, filtering the output of the microcells creates a substantially symmetric pulse shape. In examples, the filter is a high-pass filter or a band-pass filter. At block 1204, timing and intensity information of the filtered output pulse is captured for at least one predetermined intensity level. At each point where the filtered output pulse reaches the at least one predetermined intensity level, timing information and intensity information associated with the output pulse is obtained. Simultaneously, at block 1206, saturation of the SiPM device is monitored. In examples, a readout circuit monitors the SiPM device for saturation during operation of the SiPM device. In some embodiments, the readout circuit determines the width of a saturation plateau of the SiPM device. At block 1208, additional intensity information of the output pulse is extrapolated based on the timing and intensity information, and a width of a saturation plateau. In some embodiments, a TDC determines timing information that is used for the pulse shape and saturation correction when SiPM sensor is saturated.

According to some non-limiting embodiments or examples, provided is a method, comprising filtering, using at least one processor, output pulses of an SiPM device to a substantially symmetric pulse shape; capturing, using the at least one processor, timing information and intensity information of the filtered output pulses for at least one predetermined intensity level; monitoring, using the at least one processor, saturation of the SiPM device, wherein a width of a saturation plateau of a respective output pulse is determined in response to saturation of the SiPM device; and extrapolating, using the at least one processor, additional timing and intensity information of the respective output pulse using captured timing information, intensity information, and width of the saturation plateau.

According to some non-limiting embodiments or examples, provided is a system, comprising at least one processor, and at least one non-transitory storage media storing instructions that, when executed by the at least one processor, cause the at least one processor to: filter output pulses of an SiPM device to a substantially symmetric pulse shape; capture timing information and intensity information of the filtered output pulses for at least one predetermined intensity level; monitor saturation of the SiPM device, wherein a width of a saturation plateau of a respective output pulse is determined in response to saturation of the SiPM device; and extrapolate additional timing and intensity information of the respective output pulse using captured timing information, intensity information, and width of the saturation plateau.

According to some non-limiting embodiments or examples, provided is at least one non-transitory computer-readable medium comprising one or more instructions that, when executed by at least one processor, cause the at least one processor to: filter output pulses of an SiPM device to a substantially symmetric pulse shape; capture timing information and intensity information of the filtered output pulses for at least one predetermined intensity level; monitor saturation of the SiPM device, wherein a width of a saturation plateau of a respective output pulse is determined in response to saturation of the SiPM device; and extrapolate additional timing and intensity information of the respective output pulse using captured timing information, intensity information, and width of the saturation plateau.

Further non-limiting aspects or embodiments are set forth in the following numbered clauses:

Clause 1: A method of increasing the silicon photomultiplier (SiPM) dynamic range, comprising filtering, using at least one processor, output pulses of an SiPM device to a substantially symmetric pulse shape; capturing, using the at least one processor, timing information and intensity information of the filtered output pulses for at least one predetermined intensity level; monitoring, using the at least one processor, saturation of the SiPM device, wherein a width of a saturation plateau of a respective output pulse is determined in response to saturation of the SiPM device; and extrapolating, using the at least one processor, additional timing information and additional intensity information of the respective output pulse using the captured timing information, the captured intensity information, and the determined width of the saturation plateau Clause 2: The method of clause 1, wherein filtering the output pulses comprise applying a high-pass filter, C-R shaper, a bandpass filter, or any combinations thereof to the output pulse.

Clause 3: The method of any one of the preceding clauses, wherein the at least one predetermined intensity level is a saturation level, where the SiPM device is saturated.

Clause 4: The method of any one of the preceding clauses, wherein readout circuitry external to the SiPM device monitors saturation of the SiPM device.

Clause 5: The method of any one of the preceding clauses, wherein monitoring saturation of the SiPM device comprises monitoring the output pulses using a comparator and a Time-to-digital converter (TDC), an analog-to-digital converter (ADC), or any combinations thereof.

Clause 6: The method of any one of the preceding clauses, wherein a width of the output pulses varies in response to modified pulses emitted by an emitter.

Clause 7: The method of any one of the preceding clauses, wherein the intensity information obtained from the filtered output pulse is used to correct timing information.

Clause 8: A system, comprising: at least one processor, and at least one non-transitory storage media storing instructions that, when executed by the at least one processor, cause the at least one processor to: filter output pulses of an SiPM device to a substantially symmetric pulse shape; capture timing information and intensity information of the filtered output pulses for at least one predetermined intensity level; monitor saturation of the SiPM device, wherein a width of a saturation plateau of a respective output pulse is determined in response to saturation of the SiPM device; and extrapolate additional timing information and additional intensity information of the respective output pulse using the captured timing information, the captured intensity information, and the determined width of the saturation plateau Clause 9: The system of clause 8, wherein filtering the output pulses comprise applying a high-pass filter, C-R shaper, a bandpass filter, or any combinations thereof to the output pulse.

Clause 10: The system of any one of the preceding clauses, wherein the at least one predetermined intensity level is a saturation level, where the SiPM device is saturated.

Clause 11: The system of any one of the preceding clauses, wherein readout circuitry external to the SiPM device monitors saturation of the SiPM device.

Clause 12: The system of any one of the preceding clauses, wherein monitoring saturation of the SiPM device comprises monitoring the output pulses using a comparator and a Time-to-digital converter (TDC), an analog-to-digital converter (ADC), or any combinations thereof.

Clause 13: The system of any one of the preceding clauses, wherein a width of the output pulses varies in response to modified pulses emitted by an emitter.

Clause 14: The system of any one of the preceding clauses, wherein the intensity information obtained from the filtered output pulse is used to correct timing information.

Clause 15: At least one non-transitory storage media storing instructions that, when executed by at least one processor, cause the at least one processor to: filter output pulses of an SiPM device to a substantially symmetric pulse shape; capture timing information and intensity information of the filtered output pulses for at least one predetermined intensity level; monitor saturation of the SiPM device, wherein a width of a saturation plateau of a respective output pulse is determined in response to saturation of the SiPM device; and extrapolate additional timing information and additional intensity information of the respective output pulse using the captured timing information, the captured intensity information, and the determined width of the saturation plateau.

Clause 16: The least one non-transitory storage media of clause 15, wherein filtering the output pulses comprise applying a high-pass filter, C-R shaper, a bandpass filter, or any combinations thereof to the output pulse.

Clause 17: The least one non-transitory storage media of any one of the preceding clauses, wherein the at least one predetermined intensity level is a saturation level, where the SiPM device is saturated.

Clause 18: The least one non-transitory storage media of any one of the preceding clauses, wherein readout circuitry external to the SiPM device monitors saturation of the SiPM device.

Clause 19: The least one non-transitory storage media of any one of the preceding clauses, wherein monitoring saturation of the SiPM device comprises monitoring the output pulses using a comparator and a Time-to-digital converter (TDC), an analog-to-digital converter (ADC), or any combinations thereof.

Clause 20: The least one non-transitory storage media of any one of the preceding clauses, wherein a width of the output pulses varies in response to modified pulses emitted by an emitter.

In the foregoing description, aspects and embodiments of the present disclosure have been described with reference to numerous specific details that can vary from implementation to implementation. Accordingly, the description and drawings are to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction. Any definitions expressly set forth herein for terms contained in such claims shall govern the meaning of such terms as used in the claims. In addition, when we use the term "further comprising," in the foregoing description or following claims, what follows this phrase can be an additional step or entity, or a sub-step/sub-entity of a previously-recited step or entity.

What is claimed is:

1. A method of increasing a silicon photomultiplier (SiPM) dynamic range, comprising:
   filtering, using at least one processor, output pulses of an SiPM device to a substantially symmetric pulse shape;
   capturing, using the at least one processor, timing information and intensity information of the filtered output pulses for at least one predetermined intensity level;
   monitoring, using the at least one processor, saturation of the SiPM device, wherein a width of a saturation plateau of a respective output pulse is determined in response to saturation of the SiPM device; and
   extrapolating, using the at least one processor, additional timing information and additional intensity information of the respective output pulse using the captured timing information, the captured intensity information, and the determined width of the saturation plateau.

2. The method of claim 1, wherein filtering the output pulses comprise applying a high-pass filter, C-R shaper, a bandpass filter, or any combinations thereof to the output pulse.

3. The method of claim 1, wherein the at least one predetermined intensity level is a saturation level, where the SiPM device is saturated.

4. The method of claim 1, wherein readout circuitry external to the SiPM device monitors saturation of the SiPM device.

5. The method of claim 1, wherein monitoring saturation of the SiPM device comprises monitoring the output pulses using a comparator and a Time-to-digital converter (TDC), an analog-to-digital converter (ADC), or any combinations thereof.

6. The method of claim 1, wherein a width of the output pulses varies in response to modified pulses emitted by an emitter.

7. The method of claim 1, wherein the intensity information obtained from the filtered output pulse is used to correct timing information.

8. A system, comprising:
   at least one processor, and
   at least one non-transitory storage media storing instructions that, when executed by the at least one processor, cause the at least one processor to:
   filter output pulses of an SiPM device to a substantially symmetric pulse shape;
   capture timing information and intensity information of the filtered output pulses for at least one predetermined intensity level;
   monitor saturation of the SiPM device, wherein a width of a saturation plateau of a respective output pulse is determined in response to saturation of the SiPM device; and
   extrapolate additional timing information and additional intensity information of the respective output pulse using the captured timing information, the captured intensity information, and the determined width of the saturation plateau.

9. The system of claim 8, wherein filtering the output pulses comprise applying a high-pass filter, C-R shaper, a bandpass filter, or any combinations thereof to the output pulse.

10. The system of claim 8, wherein the at least one predetermined intensity level is a saturation level, where the SiPM device is saturated.

11. The system of claim 8, wherein readout circuitry external to the SiPM device monitors saturation of the SiPM device.

12. The system of claim 8, wherein monitoring saturation of the SiPM device comprises monitoring the output pulses using a comparator and a Time-to-digital converter (TDC), an analog-to-digital converter (ADC), or any combinations thereof.

13. The system of claim 8, wherein a width of the output pulses varies in response to modified pulses emitted by an emitter.

14. The system of claim 8, wherein the intensity information obtained from the filtered output pulse is used to correct timing information.

15. At least one non-transitory storage media storing instructions that, when executed by at least one processor, cause the at least one processor to:
   filter output pulses of an SiPM device to a substantially symmetric pulse shape;
   capture timing information and intensity information of the filtered output pulses for at least one predetermined intensity level;
   monitor saturation of the SiPM device, wherein a width of a saturation plateau of a respective output pulse is determined in response to saturation of the SiPM device; and extrapolate additional timing information and additional intensity information of the respective output pulse using the captured timing information, the capture intensity information, and the determined width of the saturation plateau.

16. The least one non-transitory storage media of claim 15, wherein filtering the output pulses comprise applying a high-pass filter, C-R shaper, a bandpass filter, or any combinations thereof to the output pulse.

17. The least one non-transitory storage media of claim 15, wherein the at least one predetermined intensity level is a saturation level, where the SiPM device is saturated.

18. The least one non-transitory storage media of claim 15, wherein readout circuitry external to the SiPM device monitors saturation of the SiPM device.

19. The least one non-transitory storage media of claim 15, wherein monitoring saturation of the SiPM device comprises monitoring the output pulses using a comparator and a Time-to-digital converter (TDC), an analog-to-digital converter (ADC), or any combinations thereof.

20. The least one non-transitory storage media of claim 15, wherein a width of the output pulses varies in response to modified pulses emitted by an emitter.

* * * * *